US012531392B2

(12) United States Patent
Shiraishi et al.

(10) Patent No.: US 12,531,392 B2
(45) Date of Patent: Jan. 20, 2026

(54) LIGHT EMITTING DEVICE AND MEASUREMENT APPARATUS

(71) Applicant: FUJIFILM Business Innovation Corp., Tokyo (JP)

(72) Inventors: Emiko Shiraishi, Tokyo (JP); Takashi Kondo, Kanagawa (JP); Takafumi Higuchi, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 845 days.

(21) Appl. No.: 17/747,987

(22) Filed: May 18, 2022

(65) Prior Publication Data

US 2023/0125222 A1   Apr. 27, 2023

(30) Foreign Application Priority Data

Oct. 25, 2021   (JP) ................................ 2021-173678

(51) Int. Cl.
*H01S 5/042* (2006.01)
*G01B 11/24* (2006.01)
(Continued)

(52) U.S. Cl.
CPC .......... *H01S 5/04256* (2019.08); *G01B 11/24* (2013.01); *H01S 5/4018* (2013.01); *H01S 5/423* (2013.01)

(58) Field of Classification Search
CPC .... H01S 5/04256; H01S 5/4018; H01S 5/423; H01S 5/0239; H01S 5/06216;
(Continued)

(56) References Cited

U.S. PATENT DOCUMENTS 5,561,683 A * 10/1996 Kwon ................. H01S 5/18391
372/50.1
10,477,635 B1 * 11/2019 Kondo ................. H10H 29/142
(Continued)

FOREIGN PATENT DOCUMENTS

| JP | 2002111063 | 4/2002 |
| JP | 2020035879 | 3/2020 |
| JP | 2021150651 | 9/2021 |

OTHER PUBLICATIONS

"Office Action of Japan Counterpart Application", issued on Aug. 12, 2025, with English translation thereof, p. 1-p. 3.
(Continued)

*Primary Examiner* — Xinning (Tom) Niu
(74) *Attorney, Agent, or Firm* — JCIPRNET

(57) ABSTRACT

A light emitting device includes light emitting elements that are arranged on a front surface of a substrate and emit light, a first electrode that is connected to a first line controlling light emission of a light emitting element included in a first light emitting element group, and a second electrode that is connected to a second line controlling light emission of a light emitting element included in a second light emitting element group, in which the first line is provided through a space above the light emitting element of the second light emitting element group, and a position at which the first electrode is disposed with respect to a center of the light emitting element and a position at which the second electrode is disposed with respect to a center of the light emitting element are different from each other.

20 Claims, 14 Drawing Sheets

(51) Int. Cl.
*H01S 5/40* (2006.01)
*H01S 5/42* (2006.01)

(58) Field of Classification Search
CPC .............. H01S 5/0261; H01S 5/18311; H01S 2301/176; H01S 5/02345; G01B 11/24; G06F 21/32
See application file for complete search history.

(56) References Cited

U.S. PATENT DOCUMENTS

| | | | |
|---|---|---|---|
| 2018/0234583 A1* | 8/2018 | Kondo | ............... H10F 30/263 |
| 2020/0077478 A1* | 3/2020 | Kondo | ............. H10H 20/813 |
| 2021/0296862 A1 | 9/2021 | Kondo | |

OTHER PUBLICATIONS

"Office Action of Japan Counterpart Application", issued on May 27, 2025, with English translation thereof, p. 1-p. 6.

* cited by examiner

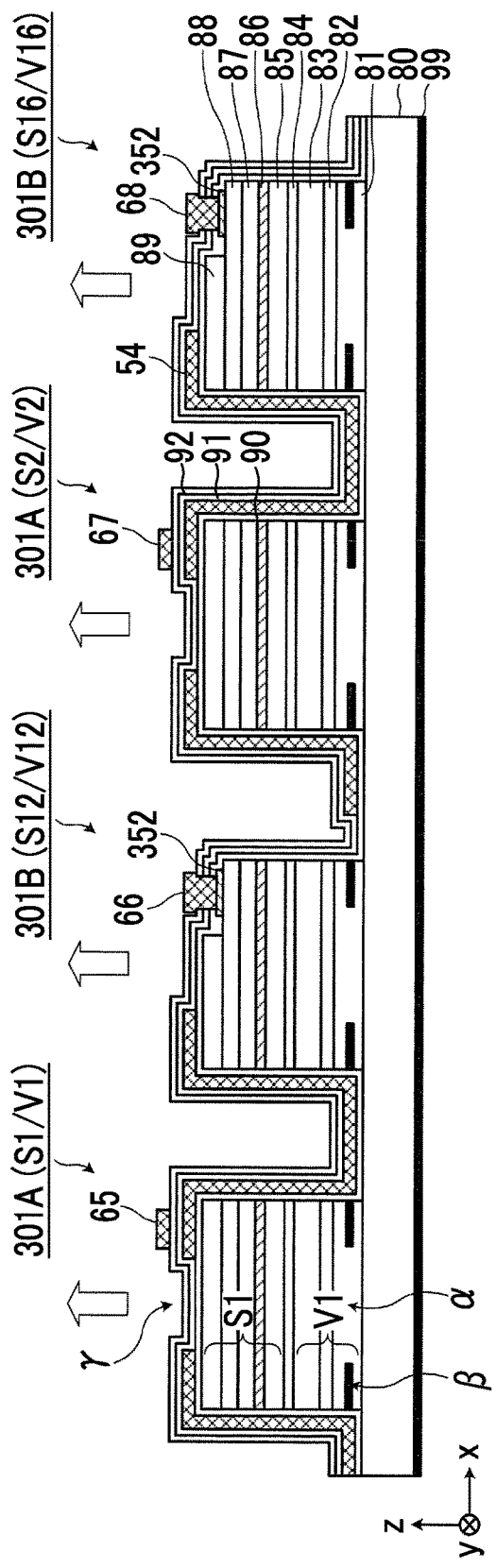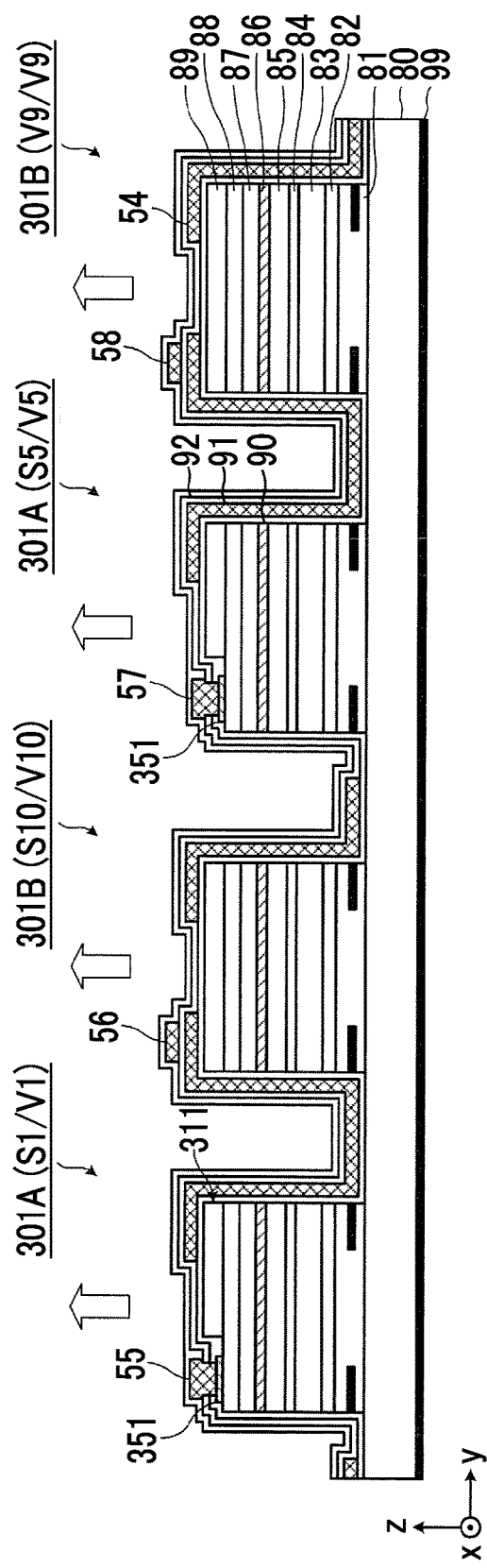

LIGHT EMITTING DEVICE AND MEASUREMENT APPARATUS

CROSS-REFERENCE TO RELATED APPLICATIONS

This application is based on and claims priority under 35 USC 119 from Japanese Patent Application No. 2021-173678 filed Oct. 25, 2021.

BACKGROUND (i) Technical Field

The present invention relates to a light emitting device and a measurement apparatus.

(ii) Related Art

Regarding a method of measuring the three-dimensional shape of a measurement target by irradiating the measurement target with light from a light emitting device and receiving light reflected from the measurement target, there is a technique of irradiating the measurement target with light while switching between a plurality of light emitting element groups provided in the light emitting device. Such irradiation will be referred to as fractionated irradiation.

Described in JP2020-35879A is a light emitting device 10 including a light emission unit 100 and a drive unit 110. FIG. 12 is a view showing the planar layout of the light emission unit 100 (Related Art Example 1), which is FIG. 2 in JP2020-35879A. The light emission unit 100 includes a plurality of laser diodes LD as light emitting elements. Furthermore, a plurality of transfer thyristors Th (transfer thyristors Th1 to Th4) and a plurality of transfer thyristors Tv (transfer thyristors Tv1 to Tv4) are provided. In addition, a plurality of drive thyristors U that are connected to the transfer thyristors Th and that become able to transition to an ON state in a case where the transfer thyristors Th enter an ON state, a plurality of setting thyristors S that are connected to the transfer thyristors Tv and that become able to transition to an ON state in a case where the transfer thyristors Tv enter an ON state, and a plurality of drive thyristors B that are connected to the setting thyristors S and that become able to transition to an ON state in a case where the setting thyristors S enter the ON state are provided.

The drive thyristors U, the drive thyristors B, and the laser diodes LD are laminated and connected in series. For example, an island 301 is configured by laminating a laser diode LD11, a drive thyristor B11, and a drive thyristor U11 on a substrate in this order. Note that, in FIG. 12, a laminate of the laser diode LD11, the drive thyristor B11, and the drive thyristor U11 is represented by "U/B/LD11".

The drive thyristor U11 is provided with a p-ohmic electrode 352. The p-ohmic electrode 352 is connected to an h-gate signal line 55. The drive thyristor B11 is provided with a p-ohmic electrode 351. The p-ohmic electrode 351 is connected to a v-gate signal line 65.

In an n region 311 of the island 301, an n-ohmic electrode 331 that easily makes an ohmic contact with an n-type semiconductor layer is provided in a U-like shape. In addition, a light emitting signal line 54 is connected to the n-ohmic electrode 331.

In a case where the transfer thyristor Th1 enters an ON state, the drive thyristor U11 becomes able to transition to an ON state via the h-gate signal line 55. Similarly, in a case where the transfer thyristor Tv1 enters an ON state and the setting thyristors S1 connected to the transfer thyristors Tv1 enters an ON state, the drive thyristor B11 becomes able to transition to an ON state via the v-gate signal line 65. In addition, in a case where both of the drive thyristor U11 and the drive thyristor B11 become able to transition to an ON state, the laser diode LD11 lights up (emits light). The same applies to other laser diodes LD.

In a case where the setting thyristors S are set to enter an ON state or an OFF state at a time at which an ON state is transferred by the transfer thyristors Th and the transfer thyristors Tv and both of the transfer thyristors Th and the transfer thyristors Tv are in the ON state, the laser diodes LD are set to light up or not to light up. Here, a plurality of laser diodes LD are set as one light emitting element group for the ON state and the OFF state of the setting thyristors S. Since a plurality of light emitting element groups are set, light emission is performed while switching between the light emitting element groups. Note that a combination of light emitting elements constituting a light emitting element group is changed in a case where the setting thyristors S are set to enter the ON state or the OFF state.

In a region where the laser diodes LD of the light emission unit 100 of the light emitting device 10 shown in FIG. 12 are arranged, h-gate signal lines (h-gate signal lines 55 to 58) and v-gate signal lines (v-gate signal lines 65 to 68) that control light emission of the laser diodes LD are intricately provided. Two p-ohmic electrodes 351 and 352 are provided for each of the laser diodes LD.

In the light emitting device 10 shown in FIG. 12, the h-gate signal lines (h-gate signal lines 55 to 58) and the v-gate signal lines (v-gate signal lines 65 to 68) are provided in wiring regions between islands (islands similar to island 301 provided with laser diode LD11, drive thyristor B11, and drive thyristor U11) in which the laser diodes LD, the drive thyristors B, and the drive thyristors U are laminated. Accordingly, the distances between the laser diodes LD are limited by the wiring regions. Therefore, it is difficult to reduce the distances between the laser diodes LD and arrange the laser diodes LD at a high density.

Described in JP2021-150651A is a VCSEL array 10 including a plurality of VCSEL groups and a transfer thyristor T or the like provided for each VCSEL group. FIG. 13 is a view showing the planar layout of the VCSEL array 10 (Related Art Example 2), which is FIG. 7 in JP2021-150651A. Here, a setting thyristor S (S1 in FIG. 13) is provided for each VCSEL group. The setting thyristors S are provided on a substrate 80 and a plurality of VCSELs included in the VCSEL groups are laminated on the setting thyristors S. The setting thyristors S and the plurality of VCSELs provided on the setting thyristors constitute islands 301.

Regarding the islands 301, p-ohmic electrodes 331 of the setting thyristors S and islands 302 provided with the transfer thyristors T are connected to each other by wires 75.

In a case where the transfer thyristors T transition into an ON state, the setting thyristors S become able to transition into an ON state via the wires 75. At this time, the VCSELs included in the VCSEL groups emit light in a case where a light emitting signal line 76 reaches a low-level potential "L". With propagation of an ON state in a plurality of transfer thyristors T, light emission is switched between the VCSEL groups. Therefore, the VCSEL array can perform fractionated irradiation. Note that, in the VCSEL array 10, the VCSELs that emit light are disposed as a mass for each island 301 in the form of the VCSEL group.

As shown in FIG. 13, in a case where the wire 75 is to be connected to a VCSEL group other than one VCSEL group, the wire 75 is provided through a space above the one VCSEL group. The wires 75 are provided in wiring regions between the VCSELs to avoid the VCSELs. Therefore, the distances between the VCSELs are limited by the wiring regions. Therefore, it is difficult to reduce the distances between the VCSELs and arrange the VCSELs at a high density.

Described in JP2002-111063A is a self-scanning light emitting element array chip in which the number of light emission points that can light up at the same time is two for each chip. FIG. 14 is a plan view of the self-scanning light emitting element array chip (Related Art Example 3), which is FIG. 19 in JP2002-111063A. Each of a write signal $\varphi_I L$ line and a write signal $\varphi_I R$ line connected to anode electrodes of light emitting elements is divided into two parts, the light emitting elements are alternately connected to two $\varphi_I L$ lines 43-1 and 43-2 at a left side circuit 40, and the light emitting elements are alternately connected to two $\varphi_I R$ lines 53-1 and 53-2 at a right side circuit 50. Accordingly, four light emission points light up at the same time for each chip. Here, the $\varphi_I L$ line 43-1 is provided above and outside the light emitting elements, and the $\varphi_I L$ line 43-2 is provided below and outside the light emitting elements. Each wire is connected to different anode electrodes alternately.

SUMMARY

Light emitting elements in a light emitting device that measures a three-dimensional shape are required to be arranged at a high density in some cases.

Aspects of non-limiting embodiments of the present disclosure relate to a light emitting device in which light emitting elements are arranged at a high density.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light emitting device including light emitting elements that are arranged on a front surface of a substrate and emit light, a first electrode that is connected to a first line controlling light emission of a light emitting element included in a first light emitting element group, and a second electrode that is connected to a second line controlling light emission of a light emitting element included in a second light emitting element group, in which the first line is provided through a space above the light emitting element of the second light emitting element group, and a position at which the first electrode is disposed with respect to a center of the light emitting element and a position at which the second electrode is disposed with respect to a center of the light emitting element are different from each other.

BRIEF DESCRIPTION OF THE DRAWINGS

Exemplary embodiment(s) of the present invention will be described in detail based on the following figures, wherein:

FIGS. 6A and 6B are cross-sectional views of a group of islands provided with the setting thyristors/VCSELs, where FIG. 6A is a cross-sectional view taken along line VIA-VIA in FIG. 4 and FIG. 6B is a cross-sectional view taken along line VIB-VIB in FIG. 4;

DETAILED DESCRIPTION

Figure 1:
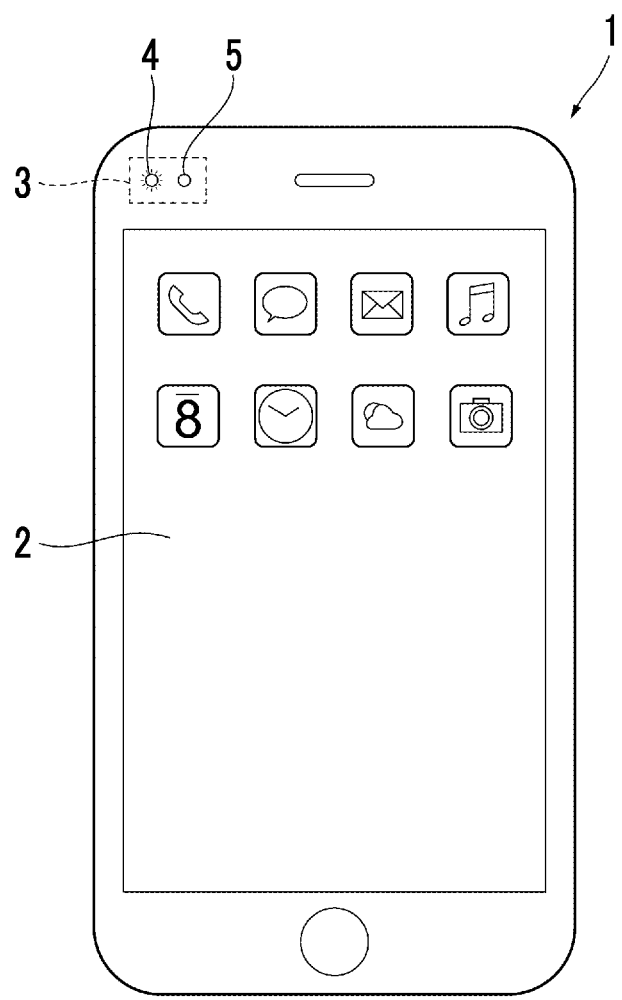
FIG. 1 is a view showing an example of an information processing device.

Hereinafter, an exemplary embodiment (example) of the present invention will be described in detail with reference to the accompanying drawings. Note that terms and reference numerals used below are different from terms and reference numerals used in description of the related arts.

As a measurement apparatus that measures the three-dimensional shape (hereinafter, will be referred to as 3D shape) of a measurement target, there is a device that measures a 3D shape based on a so-called time-of-flight (ToF) method in which the time-of-flight of light is used. In the ToF method, a time between when light is emitted from a light emitting device of a measurement apparatus and when the light is reflected from a measurement target and is received by a three-dimensional sensor (hereinafter, will be referred to as 3D sensor) of the measurement apparatus is measured and the 3D shape of the measurement target is specified based on the measured time. Note that the target of which the 3D shape is to be measured will be referred to as a measurement target. A 3D shape may be referred to as a three-dimensional image or a 3D image. In addition, measurement of a 3D shape may be referred to as three-dimensional measurement, 3D measurement, or 3D sensing.

Such a measurement apparatus is mounted in a portable information processing device or the like and is used for face recognition of a user who tries to access the device. In the related art, a method of authenticating a user of a portable information processing device or the like by means of a password, a fingerprint, an iris, or the like has been used. In recent years, there is a demand for an authentication method with higher security. Therefore, recently, measurement apparatuses for measurement of a three-dimensional shape are mounted in portable information processing devices. That is, the 3D shape of the face of a user accessing a portable information processing device is acquired, whether or not the user is permitted to access the portable information processing device is identified, and use of the portable information processing device is permitted only in a case where the user is authenticated as a user permitted to access the portable information processing device.

Here, description will be made on the assumption that an information processing device is a portable information processing terminal and authentication of a user is performed by recognizing the shape of a face captured in the form of a 3D shape, for example. Note that the information processing device can be applied to an information processing device other than a portable information processing terminal like a personal computer (PC) or the like.

Configurations, functions, methods, and the like described in the present exemplary embodiment can also be applied to recognition of a measurement target other than a face in which the measurement target is recognized based on a measured 3D shape. In addition, such a measurement apparatus can also be applied to the case of augmented reality (AR) or the like in which the 3D shape of a measurement target is continuously measured. In addition, a distance to a measurement target does not matter.

Information Processing Device 1

FIG. 1 is a view showing an example of an information processing device 1. As described above, the information processing device 1 is a portable information processing device, for example.

The information processing device 1 includes a user interface unit (hereinafter, will be referred to as UI unit) 2 and an optical device 3 that measures a 3D shape. The UI unit 2 is obtained by integrating, for example, a display device that displays information with respect to a user and an input device that the user operates to input an instruction with respect to information processing. The display device is, for example, a liquid crystal display or an organic EL display and the input device is, for example, a touch panel.

The optical device 3 includes a light emitting device 4 and a 3D sensor 5. The light emitting device 4 irradiates a measurement target (in this example, face) with light. The 3D sensor 5 acquires light that returns after being reflected from the face irradiated by the light emitting device 4. Here, a 3D shape is measured based on a so-called ToF method in which the time-of-flight of light is used. Then, the 3D shape of the face is specified. As described above, the 3D shape of a measurement target other than the face may also be measured. That is, the optical device 3 is an example of a measurement apparatus that measures a 3D shape.

The information processing device 1 is configured as a computer including a CPU, a ROM, a RAM, and the like. Note that the ROM includes a non-volatile rewritable memory, for example, a flash memory. A program and a constant stored in the ROM are deployed in the RAM and the CPU executes the program so that the information processing device 1 is operated and various information processing is performed.

Figure 2:
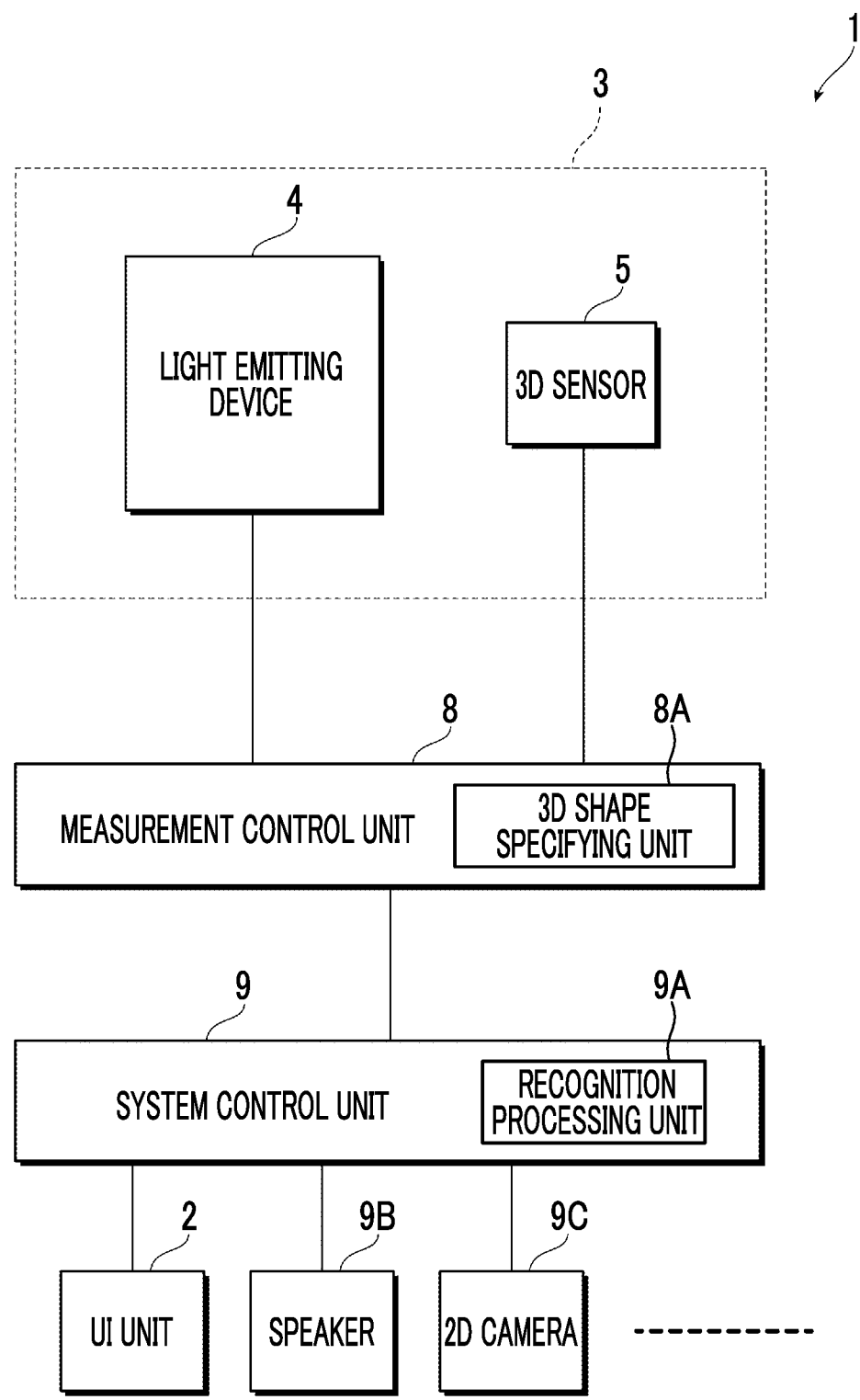
FIG. 2 is a block diagram for description of the configuration of the information processing device.

FIG. 2 is a block diagram for description of the configuration of the information processing device 1.

The information processing device 1 includes the above-described optical device 3, a measurement control unit 8, and a system control unit 9. The measurement control unit 8 controls the optical device 3. The measurement control unit 8 includes a 3D shape specifying unit 8A. The system control unit 9 controls the entire information processing device 1 as a system. The system control unit 9 includes a recognition processing unit 9A. The UI unit 2, a speaker 9B, a two-dimensional camera ("2D camera" in FIG. 2) 9C, and the like are connected to the system control unit 9.

The 3D shape specifying unit 8A included in the measurement control unit 8 measures a 3D shape based on light reflected from a measurement target to specify the 3D shape of the measurement target. The recognition processing unit 9A included in the system control unit 9 identifies whether or not accessing the information processing device 1 is permitted based on the 3D shape specified by the 3D shape specifying unit 8A and authenticates a user permitted to access the information processing device 1.

Note that the measurement apparatus may include the measurement control unit 8 in addition to the optical device 3.

Light Emitting Device 4

As will be described later, the light emitting device 4 is configured by arranging a plurality of light emitting elements in a two-dimensional manner. The light emitting device 4 is divided into a plurality of light emitting element groups each of which is composed of two or more light emitting elements. In the light emitting device 4, light emission is controlled for each light emitting element group, and light emission is switched for each light emitting element group. That is, the light emitting device 4 performs fractionated irradiation on a measurement target with light.

Here, the light emitting elements are, for example, vertical cavity surface emitting lasers (VCSELs) and will be referred to as VCSELs hereinafter. Note that, in the drawings, the VCSELs are represented by "V". Since the VCSELs are surface emitting lasers, it is easy to two-dimensionally arrange a plurality of VCSELs on a substrate (substrate 80 shown in FIGS. 6A and 6B which will be described later) and to cause the VCSELs to emit light in a direction perpendicular to the substrate.

Equivalent Circuit of Light Emitting Device 4

Figure 3:
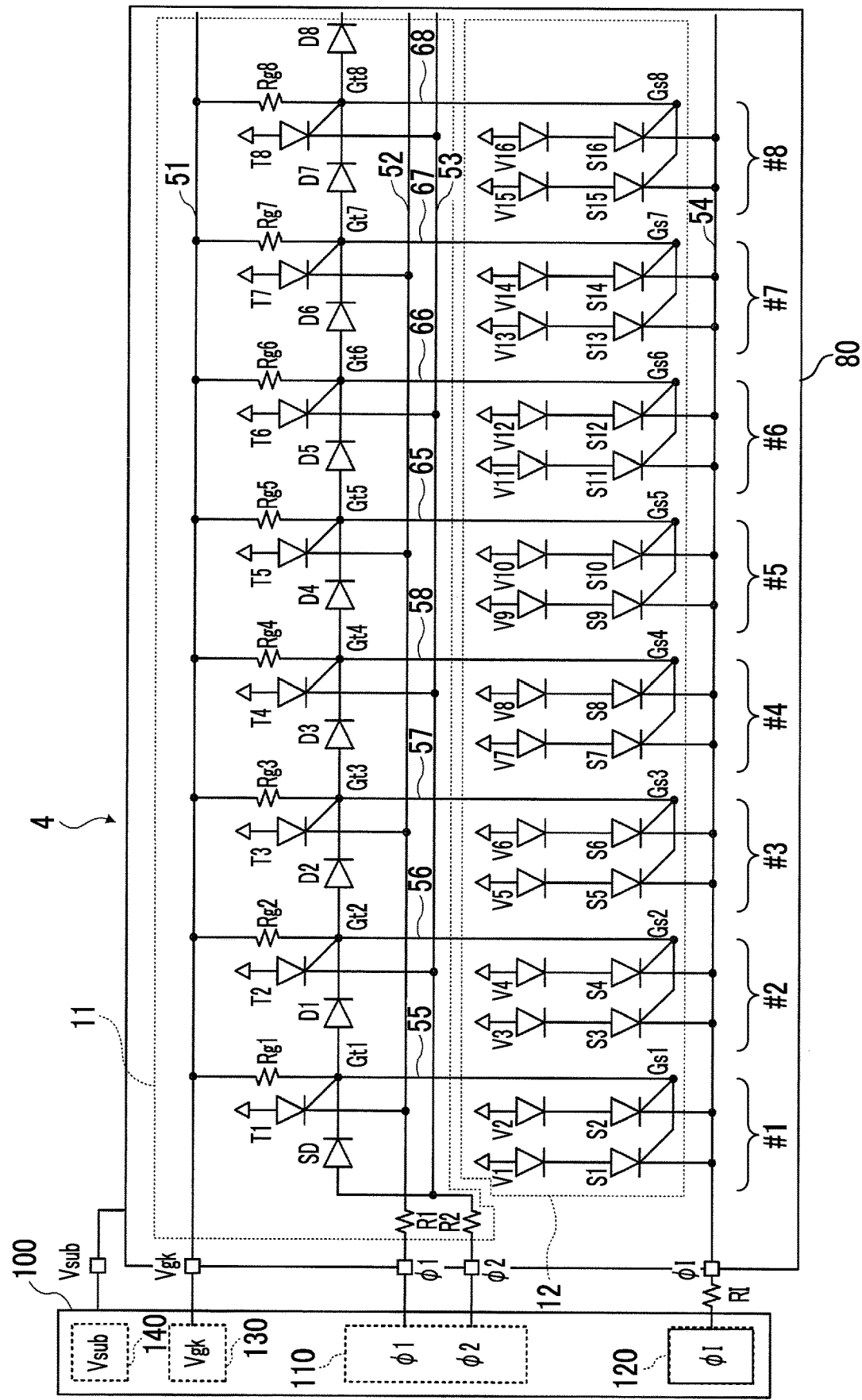
FIG. 3 is a diagram showing an example of an equivalent circuit of a light emitting device to which an exemplary embodiment is applied.

FIG. 3 is a diagram showing an example of an equivalent circuit of the light emitting device 4 to which the present exemplary embodiment is applied. FIG. 3 shows, in addition to the light emitting device 4, a light emission control unit 100 that controls the light emitting device 4. The light emission control unit 100 is provided in the measurement control unit 8 in FIG. 2.

The light emitting device 4 includes a plurality of VCSELs. For example, the light emitting device 4 shown in FIG. 3 includes sixteen VCSELs (VCSEL 1 to VCSEL 16 (V1 to V16)). One light emitting element group is composed of two VCSELs. Hereinafter, the light emitting element groups will be referred to as VCSEL groups and in a case of distinguishing between the VCSEL groups, a number will be added to #. In the drawings, the VCSEL groups are represented by "#". The light emitting device 4 includes eight VCSEL groups (VCSEL group #1 to VCSEL group #8 (#1 to #8)). The VCSEL group #1 includes VCSELs 1 and 2 (V1 and V2), and the VCSEL group #2 includes VCSELs 3 and 4 (V3 and V4). The same applies to the VCSEL groups #3 to #8.

The number of VCSELs included in the light emitting device 4 and the number of VCSELs included in each VCSEL group may be other numbers. The number of VCSELs included in a VCSEL group may be different between the VCSEL groups.

In addition to the sixteen VCSELs, the light emitting device 4 includes sixteen setting thyristors S (setting thyristor S1 to setting thyristors S16), eight transfer thyristors T (transfer thyristor T1 to transfer thyristor T8), eight coupling diodes D (coupling diode D1 to coupling diode D8), a start diode SD, power line resistors Rg (power line resistor Rg1 to power line resistor Rg8), and current limiting resistors R1 and R2. In the drawings, the setting thyristors S are represented by "S", the transfer thyristors T are represented by "T", the coupling diodes D are represented by "D", and the power line resistors Rg are represented by "Rg".

The VCSELs and the coupling diodes D are two-terminal elements each including an anode and a cathode. The setting thyristors S and the transfer thyristors T are three-terminal elements each including an anode, a cathode, and a gate. The gates of the setting thyristors S will be referred to as gates Gs, and the gates of the transfer thyristors T will be referred to as gates Gt. In the drawings, the gates Gs of the setting thyristors S are represented by "Gs", and the gates Gt of the transfer thyristors T are represented by "Gt".

Here, a portion composed of the setting thyristors S and the VCSELs will be referred to as a light emission unit 12 and a portion composed of the transfer thyristors T, the coupling diodes D, the start diode SD, the power line resistors Rg, and the current limiting resistors R1 and R2 will be referred to as a transfer unit 11.

Next, the connection relationship of each element (VCSELs, setting thyristors S, transfer thyristors T, and the like) will be described with reference to FIG. 3.

The VCSELs and the sixteen setting thyristors S form pairs and are connected in series. That is, the anodes of the VCSELs are connected to reference potentials Vsub (here, ground potentials (GND)) and the cathodes thereof are connected to the anodes of the setting thyristors S. The reference potentials Vsub (ground potentials (GND)) are represented by inverted triangles. The cathodes of the setting thyristors S are connected to a light emission wire 54 that supplies a current (light emission current) for light emission to the VCSELs. The light emission wire 54 is connected to a φI terminal. The gates Gs of the setting thyristors S connected to VCSELs in each VCSEL group are connected to each other.

For example, in the case of the VCSEL group #1, each of the anodes of the VCSEL 1 (V1) and the VCSEL 2 (V2) is connected to the reference potential Vsub. The cathode of the VCSEL 1 (V1) is connected to the anode of the setting thyristor S1, and the cathode of the VCSEL 2 (V2) is connected to the anode of the setting thyristor S2. Each of the cathodes of the setting thyristor S1 and the setting thyristor S2 is connected to the light emission wire 54. A gate Gs1 of the setting thyristor S1 and a gate Gs2 of the setting thyristor S2 are connected to each other.

The anodes of the transfer thyristors T are connected to the reference potentials Vsub. The cathodes of the odd-numbered transfer thyristors T1, T3, T5, and T7 are connected to a transfer signal line 52. The transfer signal line 52 is connected to a φ1 terminal via the current limiting resistor R1.

The cathodes of the even-numbered transfer thyristors T2, T4, T6, and T8 are connected to a transfer signal line 53. The transfer signal line 53 is connected to a φ2 terminal via the current limiting resistor R2.

The gates Gt of the transfer thyristors T are connected to the gates Gs of the setting thyristors S connected to the VCSELs belonging to the VCSEL groups. For example, a gate Gt1 of the transfer thyristor T1 is connected to the gates Gs1 and Gs2 of the setting thyristors S1 and S2 connected to the VCSELs 1 and 2 (V1 and V2) belonging to the VCSEL group #1 via a gate signal line 55. A gate Gt2 of the transfer thyristor T2 is connected to gates Gs3 and Gs4 of the setting thyristors S3 and S4 connected to the VCSELs 3 and 4 (V3 and V4) of the VCSEL group #2 via a gate signal line 56. A gate Gt3 of the transfer thyristor T3 is connected to gates Gs5 and Gs6 of the setting thyristors S5 and S6 connected to the VCSELs 5 and 6 (V5 and V6) of the VCSEL group #3 via a gate signal line 57. A gate Gt4 of the transfer thyristor T4 is connected to gates Gs7 and Gs8 of the setting thyristors S7 and S8 connected to the VCSELs 7 and 8 (V7 and V8) of the VCSEL group #4 via a gate signal line 58. The VCSEL group #1 is an example of a first light emitting element group.

Similarly, a gate Gt5 of the transfer thyristor T5 is connected to gates Gs9 and Gs10 of the setting thyristors S9 and S10 connected to the VCSELs 9 and 10 (V9 and V10) of the VCSEL group #5 via a gate signal line 65. A gate Gt6 of the transfer thyristor T6 is connected to gates Gs11 and Gs12 of the setting thyristors S11 and S12 connected to the VCSELs 11 and 12 (V11 and V12) of the VCSEL group #6 via a gate signal line 66. A gate Gt7 of the transfer thyristor T7 is connected to gates Gs13 and Gs14 of the setting thyristors S13 and S14 connected to the VCSELs 13 and 14 (V13 and V14) of the VCSEL group #7 via a gate signal line 67. A gate Gt8 of the transfer thyristor T8 is connected to gates Gs15 and Gs16 of the setting thyristors S15 and S16 connected to the VCSELs 15 and 16 (V15 and V16) of the VCSEL group #8 via a gate signal line 68. The VCSEL group #5 is an example of a second light emitting element group.

The gates Gt of the transfer thyristors T are connected to a power line 51 via the power line resistors Rg. The power line 51 is connected to a Vgk terminal.

The coupling diodes D are connected with each other in series. That is, the cathode of one coupling diode D is connected to the anode of the adjacent coupling diode D. In addition, each coupling diode D is provided between the gates Gt of the transfer thyristors T adjacent to each other. For example, the coupling diode D1 is provided between the gate Gt1 of the transfer thyristor T1 and the gate Gt2 of the transfer thyristor T2. Other coupling diodes D2 to D7 are also provided in the same manner.

The anode of the start diode SD is connected to the transfer signal line 53 and the cathode thereof is connected to the anode of the coupling diode D1, that is, the gate Gt1 of the transfer thyristor T1.

Hereinafter, a combination of the setting thyristor S and the VCSEL connected in series will be referred to as a setting thyristor S1/VCSEL 1 or the like and is represented by "S1/V1" or the like in the drawings.

Next, the configuration of the light emission control unit 100 will be described.

The light emission control unit 100 generates a signal such as a light emission signal φI and supplies the signal to the light emitting device 4. The light emitting device 4 is operated by the signal supplied from the light emission control unit 100. The light emission control unit 100 is composed of an electronic circuit. For example, the light emission control unit 100 may be an integrated circuit (IC) configured to control the operation of the light emitting device 4.

The light emission control unit 100 includes a transfer signal generation unit 110, a light emission signal generation unit 120, a power potential generation unit 130, and a reference potential generation unit 140.

The transfer signal generation unit 110 generates transfer signals φ1 and φ2 and supplies the transfer signal φ1 to the φ1 terminal of the light emitting device 4 and the transfer signal φ2 to the φ2 terminal of the light emitting device 4.

The light emission signal generation unit 120 generates the light emission signal φI and supplies the light emission signal φI to the φI terminal of the light emitting device 4 via a current limiting resistor RI. The current limiting resistor RI may be provided in the light emitting device 4. In addition, in a case where the current limiting resistor RI is not necessary for the operation of the light emitting device 4, the current limiting resistor RI may not be provided.

The power potential generation unit 130 generates a power potential Vgk and supplies the power potential Vgk to the Vgk terminal of the light emitting device 4. The reference potential generation unit 140 generates the reference potential Vsub and supplies the reference potential Vsub to a Vsub terminal of the light emitting device 4. The power potential Vgk is, for example, −3.3 V. As described above, the reference potential Vsub is the ground potential (GND), that is, 0 V.

The transfer signals φ1 and φ2 generated by the transfer signal generation unit 110 and the light emission signal φI generated by the light emission signal generation unit 120 will be described later.

In the light emitting device 4 shown in FIG. 3, two VCSELs constituting one VCSEL group are connected to one transfer thyristor T via the setting thyristors S provided respectively. As will be described later, the setting thyristors S will be referred to as the setting thyristors S because the setting thyristors S set the VCSELs connected thereto to enter a state where light can be emitted.

As will be described later, in a case where the transfer thyristors T enter an ON state, the setting thyristors S connected to the transfer thyristors T become able to transition into an ON state. Then, the setting thyristors S are turned on by means of the light emission signal φI and the VCSELs connected to the setting thyristors S emit light. That is, a plurality of VCSELs included in the VCSEL group provided corresponding to each transfer thyristor T emit light in parallel. Then, the transfer thyristors T are driven such that the ON state is transferred in numerical order. Note that the expression "the ON state is transferred" means that "the ON state of the transfer thyristors T is propagated in order". Therefore, as the ON state of the transfer thyristors T is transferred, a light emission state of the VCSELs included in the VCSEL groups provided corresponding to the transfer thyristors T is transferred in order for each VCSEL group. The light emitting device 4 performs fractionated irradiation by switching a light emitting VCSEL group between the VCSEL groups by means of the transfer thyristors T.

Planar Layout of Light Emitting Device 4

Figure 4:
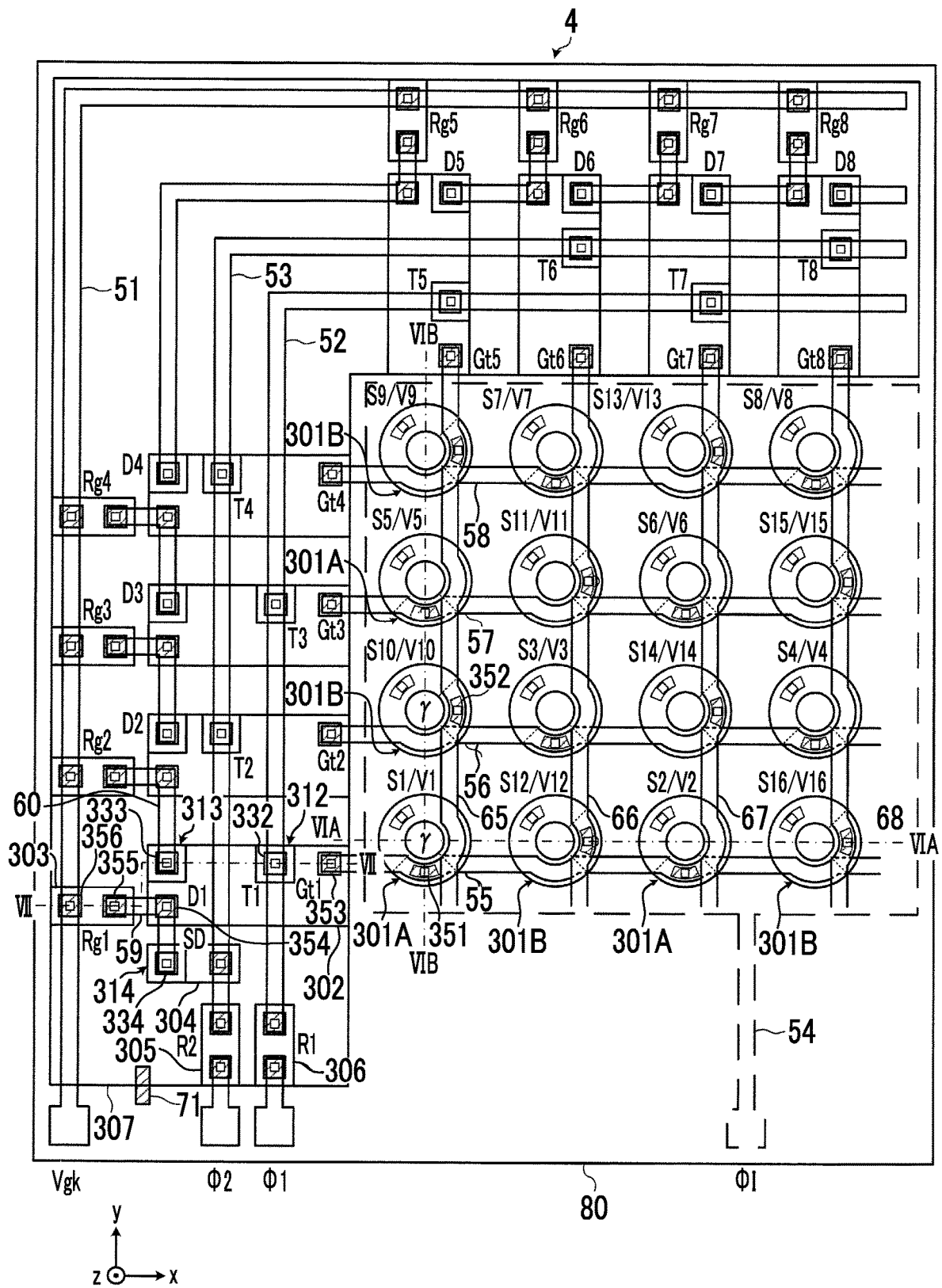
FIG. 4 is a diagram showing an example of the planar layout of the light emitting device to which the exemplary embodiment is applied.

FIG. 4 is a diagram showing an example of the planar layout of the light emitting device 4 to which the present exemplary embodiment is applied. In FIG. 4, a rightward direction of the paper surface is a direction x, an upward direction of the paper surface is a direction y, and a front surface direction of the paper surface is a direction z. In FIG. 4, wires such as the gate signal lines 55 to 58 and 65 to 68 and the transfer signal lines 52 and 53 are represented by outline shapes and through-holes (openings) are represented by squares.

The light emitting device 4 is formed of a semiconductor material capable of emitting laser light. For example, the light emitting device 4 is formed of a GaAs-based compound semiconductor. As shown in cross-sectional views (FIGS. 6A and 6B which will be described later) which will be described later, the light emitting device 4 is configured by separating a semiconductor layer laminate, which is obtained by laminating a plurality of GaAs compound semiconductor layers on a p-type GaAs substrate 80, into a plurality of island shapes. A region left in an island shape is called an island or a mesa. Etching the semiconductor layer laminate into island shapes to separate elements is called mesa etching. Here, the planar layout of the light emitting device 4 will be described by using islands 301 to 307. Description of the islands 301 will be made dividing the islands 301 into islands 301A and 301B depending on the structures thereof. Note that other islands are not given reference numerals even in a case where the islands have the same structure.

In FIG. 4, for example, the sixteen VCSELs are arranged such that four VCSELs are arranged in the direction x and four VCSELs are arranged in the direction y. The sixteen VCSELs are arranged in a 4×4 matrix. Specifically, assuming that an array in the direction x is a row, the first row includes a setting thyristor S1/VCSEL 1 (S1/V1), a setting thyristor S12/VCSEL 12 (S12/V12), a setting thyristor S2/VCSEL 2 (S2/V2), a setting thyristor S16/VCSEL 16 (S16/V16) that are arranged in this order. The second row includes a setting thyristor S10/VCSEL 10 (S10/V10), a setting thyristor S3/VCSEL 3 (S3/V3), a setting thyristor S14/VCSEL 14 (S14/V14), a setting thyristor S4/VCSEL 4 (S4/V4) that are arranged in this order. The third row includes a setting thyristor S5/VCSEL 5 (S5/V5), a setting thyristor S11/VCSEL 11 (S11/V11), a setting thyristor S6/VCSEL 6 (S6/V6), a setting thyristor S15/VCSEL 15 (S15/V15) that are arranged in this order. The fourth row includes a setting thyristor S9/VCSEL 9 (S9/V9), a setting thyristor S7/VCSEL 7 (S7/V7), a setting thyristor S13/VCSEL 13 (S13/V13), a setting thyristor S8/VCSEL 8 (S8/V8) that are arranged in this order.

In addition, the sixteen VCSELs are configured to be divided into islands 301A and 301B, each of which has a different structure. For example, the setting thyristor S1/VCSEL 1 (S1/V1) in the first row is configured as the island 301A, the setting thyristor S12/VCSEL 12 (S12/V12) is configured as the island 301B, the setting thyristor S2/VCSEL 2 (S2/V2) is configured as the island 301A, and the setting thyristor S16/VCSEL 16 (S16/V16) is configured as the island 301B. In addition, the setting thyristor S10/VCSEL 10 (S10/V10) in the second row is configured as the island 301B, the setting thyristor S3/VCSEL 3 (S3/V3) is configured as the island 301A, the setting thyristor S14/VCSEL 14 (S14/V14) is configured as the island 301B, and the setting thyristor S4/VCSEL 4 (S4/V4) is configured as the island 301A.

In each row, the islands 301A and 301B are arranged alternately. In addition, assuming that an array in the direction y is a column, the islands 301A and 301B are also arranged alternately in each column. Hereinafter, the island 301A provided with the setting thyristor S1 and the VCSEL 1 (V1) will be referred to as the island 301A (S1/V1), the island 301B provided with the setting thyristor S10 and the VCSEL 10 (V10) will be referred to as the island 301B (S10/V10), . . . and so forth to distinguish between the islands. A plurality of islands 301 provided with the setting thyristors S and the VCSELs are collectively referred to as a group of islands 301. Note that the group of islands 301 is a region where light emitting elements (here, VCSELs) are provided.

Regarding the islands 301A and 301B, the VCSEL 1 and the setting thyristor S1 are laminated in this order from a substrate 80 side and are connected in series (refer to FIGS. 6A and 6B which will be described later). Each of the islands 301A and 301B has a circular planar shape and the central portion thereof is a light emission port γ. Note that the setting thyristors S and the VCSELs may be connected in series without being laminated.

The island 302 has a quadrangular planar shape and is provided with the transfer thyristor T1 and the coupling diode D1. The island 302 is provided outside the group of islands 301 provided with the setting thyristors S/VCSELs in a direction −x. Islands similar to the island 302 are provided with other transfer thyristors T and coupling diodes D. However, the positions of the transfer thyristors T are different between islands provided with the even-numbered transfer thyristors T2 and T4 and islands provided with the odd-numbered transfer thyristors T1 and T3. Islands provided with the transfer thyristors T2 to T4 and the coupling diodes D2 to D4 are arranged in parallel in the direction y with respect to the island 302.

Meanwhile, islands provided with the transfer thyristors T5 to T8 and the coupling diodes D5 to D8 are provided outside the group of islands 301 provided with the setting thyristors S/VCSELs in the direction y. The islands provided with the transfer thyristors T5 to T8 and the coupling diodes D5 to D8 are arranged in parallel in the direction x with the island 302 rotated in a clockwise direction by 90 degrees. Other configurations are similar to the islands provided with the transfer thyristors T1 to T4.

The island 303 has a quadrangular planar shape and is provided with a power line resistor Rg1. The island 303 is provided outside the island 302 in the direction −x. Islands similar to the island 303 are provided with other power line resistors Rg. Islands provided with the power line resistors Rg2 to Rg4 are provided in parallel in the direction y with respect to the island 303. Meanwhile, islands provided with the power line resistors Rg5 to Rg8 are provided outside a group of islands provided with the transfer thyristors T5 to T8 and the coupling diodes D5 to D8 in the direction y. The islands provided with the power line resistors Rg5 to Rg8 are arranged in parallel in the direction x with the island 302 rotated in a clockwise direction by 90 degrees.

The island 304 has a quadrangular planar shape and is provided with the start diode SD, and the islands 305 and 306 are provided with the current limiting resistors R1 and R2, respectively.

As shown in FIG. 4, the transfer thyristors T, the coupling diodes D, and the like constituting the transfer unit 11 shown in FIG. 3 are provided at two places which are a direction −x side and a direction +y side of the group of islands 301 provided with the setting thyristors S and the VCSELs. In a case where the transfer units 11 are provided at two places, it is easy to provide the gate signal lines 55 to 58 and the gate signal lines 65 to 68 intersecting each other.

Here, the gate signal lines 55 to 58 and the gate signal lines 65 to 68 shown in FIG. 3 will be described. The gate signal lines 55 to 58 are wires extending in the direction x and are arranged in parallel with each other from a direction −y side to the direction +y side. The gate signal lines 65 to 68 are wires extending in the direction y and are arranged in parallel with each other from the direction −x side to the direction +x side. The gate signal lines 55 to 58 and the gate signal lines 65 to 68 intersect each other. The gate signal lines 55 to 58 and the gate signal lines 65 to 68 are composed of different wire layers insulated with insulation layers for prevention of a short circuit. The gate signal lines 55 to 58 and the gate signal lines 65 to 68 are provided through a space above the islands 301. The islands 301 are provided with the VCSELs. In other words, the gate signal lines 55 to 58 and the gate signal lines 65 to 68 are provided through a space above the VCSELs which are light emitting elements. The gate signal line 55 is an example of a first line and the gate signal line 65 is an example of a second line.

The gate signal line 55 is connected to the setting thyristor S1 (gate Gs1) and the setting thyristor S2 (gate Gs2) and is not connected to the setting thyristor S12 (gate Gs12) and the setting thyristor S16 (gate Gs16). The gate signal line 55 is connected to every other setting thyristor S of the islands 301 arranged in the direction x. Similarly, the gate signal line 56 is connected to the setting thyristor S3 (gate Gs3) and the setting thyristor S4 (gate Gs4) and is not connected to the setting thyristor S10 (gate Gs10) and the setting thyristor S14 (gate Gs14). The gate signal line 56 is also connected to every other setting thyristor S of the islands 301 arranged in the direction x.

The same applies to other gate signal lines 57 and 58. The gate signal line 65 is connected to the setting thyristor S9 (gate Gs9) and the setting thyristor S10 (gate Gs10) and is not connected to the setting thyristor S1 (gate Gs1) and the setting thyristor S5 (gate Gs5). The gate signal line 65 is connected to every other setting thyristor S of the islands 301 arranged in the direction y. Similarly, the gate signal line 66 is connected to the setting thyristor S11 (gate Gs11) and the setting thyristor S12 (gate Gs12) and is not connected to the setting thyristor S3 (gate Gs3) and the setting thyristor S7 (gate Gs7). The gate signal line 66 is also connected to every other setting thyristor S of the islands 301 arranged in the direction y. The same applies to other gate signal lines 67 and 68.

In FIG. 4, the light emission wire 54 is provided to cover the group of islands 301 except the light emission ports γ and the like. In FIG. 4, the light emission wire 54 is surrounded by a broken line so that the group of islands 301 can be seen. The details of the light emission wire 54 will be described with reference to FIG. 5 which will be described later. The light emission wire 54 is composed of another wire layer that is provided such that an insulation layer is interposed between the other wire layer and the gate signal lines 55 to 58 and the gate signal lines 65 to 68 (refer to FIGS. 6A and 6B which will be described later).

Figure 5:
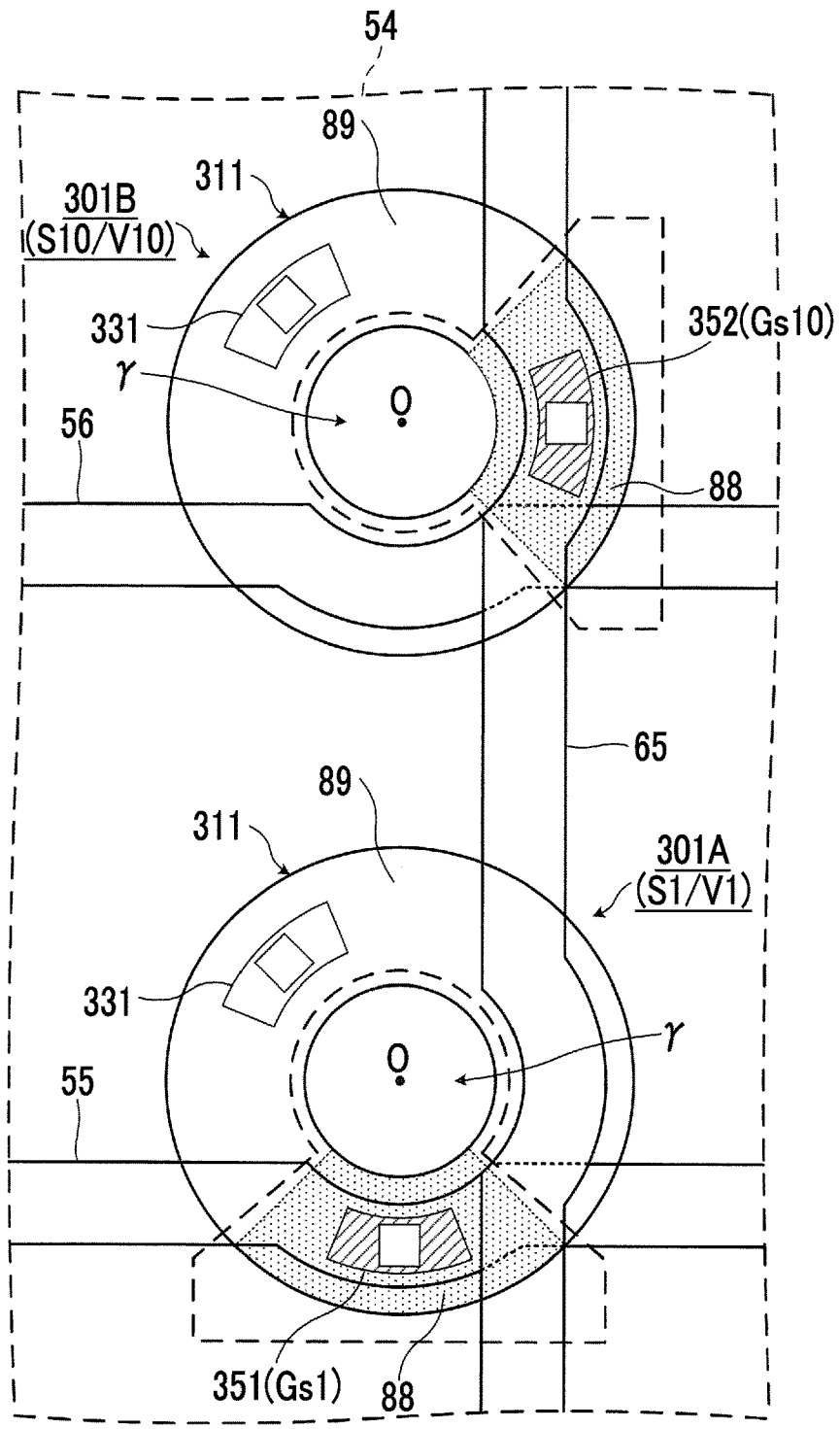
FIG. 5 is an enlarged plan view of two islands provided with setting thyristors/VCSELs in the light emitting device to which the exemplary embodiment is applied.

FIG. 5 is an enlarged plan view of two islands 301A (S1/V1) and 301B (S10/V10) provided with setting thyristors/VCSELs in the light emitting device 4 to which the present exemplary embodiment is applied. In FIG. 5, the gate signal lines 55, 56, and 65 provided through a space above the island 301A (S1/V1) and the island 301B (S10/V10) are transparently shown. Similar to FIG. 4, the light emission wire 54 is represented by a broken line. It will be assumed that the wire layer constituting the light emission wire 54, the wire layers constituting the gate signal lines 55 and 56, and the wire layer constituting the gate signal line 65 are separately provided and are laminated in this order from the substrate 80 (refer to FIGS. 6A and 6B which will be described later) side.

In the case of the island 301A (S1/V1), as shown in detail in FIGS. 6A and 6B which will be described later, an n region 311 of an uppermost n-type cathode layer (hereinafter, referred to as n-cathode layer (same applies hereinafter)) 89 is the cathode of the setting thyristor Sb. The n-cathode layer 89 is provided with an n-ohmic electrode 331 formed of a member (for example, Au (AuGe) containing Ge) that easily makes an ohmic contact with the n-cathode layer 89. The n-ohmic electrode 331 is provided on a diagonally upper left side (between direction −x side and direction +y side) in a case where the center of the light emission port γ is a center O. That is, in a case of setting angles around the center O clockwise on the assumption that the angle of the direction y is zero, the n-ohmic electrode 331 is disposed at a position of −45 degrees (315 degrees). The n-ohmic electrode 331 is connected to the light emission wire 54. The setting of the angles is the same in the following description. The n-ohmic electrode 331 is an example of a light emission electrode that supplies a light emission current to a light emitting element (here, VCSEL).

A p-type gate layer (p-gate layer) 88 (region represented by mesh pattern), which is exposed because of removal of a portion of the n-cathode layer 89 due to etching, is the gate Gs1 of the setting thyristor S1. The exposed p-gate layer 88 is provided with a p-ohmic electrode 351 formed of a member (for example, Au (AuZn) containing Zn) that easily makes an ohmic contact with the p-gate layer 88. The p-ohmic electrode 351 is connected to the gate signal line 55 extending in the direction x. The p-ohmic electrode 351 of the island 301A is disposed on a lower side (direction −y side), that is, at a position of 180 degrees to be connected to the gate signal line 55 extending in the direction x. The p-ohmic electrode 351 of the island 301A is an example of a first electrode.

In the case of the island 301B (S10/V10), the n region 311 of the uppermost n-cathode layer 89 is the cathode of the setting thyristor S10. The n-cathode layer 89 is provided with the n-ohmic electrode 331. The n-ohmic electrode 331 is disposed at a position of −45 degrees (315 degrees). The n-ohmic electrode 331 is connected to the light emission wire 54. The p-gate layer 88 (region represented by mesh pattern), which is exposed because of removal of a portion of the n-cathode layer 89 due to etching, is the gate Gs10 of the setting thyristor S10. The exposed p-gate layer 88 is provided with the p-ohmic electrode 352. The p-ohmic electrode 352 is connected to the gate signal line 65 extending in the direction y. The p-ohmic electrode 352 of the island 301B is disposed on a right side (direction +x side), that is, at a position of 90 degrees to be connected to the gate signal line 65 extending in the direction y. The p-ohmic electrode 352 of the island 301B is an example of a second electrode. The n-ohmic electrode 331, which is a light emission electrode that supplies a light emission current, is an electrode different from the first electrode and the second electrode.

The gate signal line 55 connected to the island 301A (S1/V1) belonging to the VCSEL group #1 extends around the light emission port γ on the island 301A (S1/V1) and is provided in an arc shape on an edge portion of the island 301A (S1/V1) having a cylindrical shape. In addition, the gate signal line 65 that is connected to the island 301B (S10/V10) belonging to the VCSEL group #5 and is not connected to the island 301A (S1/V1) also extends around the light emission port γ on the island 301A (S1/V1) and is provided in an arc shape on an edge portion of the island 301A (S1/V1) having a cylindrical shape. The gate signal line 55 and the gate signal line 65 are provided on the VCSEL 1 which is a light emitting element.

Similarly, the gate signal line 65 connected to the island 301B (S10/V10) belonging to the VCSEL group #5 extends around the light emission port γ on the island 301B (S10/V10) and is provided in an arc shape on an edge portion of the island 301B (S10/V10) having a cylindrical shape. In addition, the gate signal line 56 that is not connected to the island 301B (S10/V10) also extends around the light emission port γ on the island 301B (S10/V10) and is provided in an arc shape on an edge portion of the island 301B (S10/V10) having a cylindrical shape. The gate signal line 56 and the gate signal line 65 are provided on the VCSEL 10 which is a light emitting element.

The light emission wire 54 is provided to cover the group of islands 301 but includes openings at positions corresponding to the light emission ports γ and the p-ohmic electrodes 351 and 352. The light emission wire 54 includes the openings at the above-described positions so as not to hinder light emission and to facilitate the connecting of the gate signal lines to the p-ohmic electrodes 351 and 352. The shape of the openings may be a shape other than that shown in FIG. 5.

The n-ohmic electrode 331, which is a light emission electrode that supplies a light emission current, of the island 301A (S1/V1) is provided between the gate signal line 55 and the gate signal line 65. The n-ohmic electrode 331 of the island 301B (S10/V10) is provided between the gate signal line 56 and the gate signal line 65. A light emission electrode (here, n-ohmic electrode 331) is provided between the first lines (here, gate signal lines 55 and 56) and the second line (here, gate signal line 65).

The same applies to the other of the islands 301A and 301B.

As described above, a position at which the p-ohmic electrode 351 connected to the gate signal line 55 is disposed in the island 301A (S1/V1) belonging to the VCSEL group #1 and a position at which the p-ohmic electrode 352 connected to the gate signal line 65 is disposed in the island 301B (S10/V10) belonging to the VCSEL group #5 are different from each other. In addition, the angle with respect to the center O of the position at which the p-ohmic electrode 351 is disposed and the angle with respect to the center O of the position at which the p-ohmic electrode 352 is disposed are 180 degrees and 90 degrees respectively and are different from each other with an angular difference of 90 degrees. Note that the p-ohmic electrode 351 of the island 301A (S1/V1) may be provided on an upper side (direction +y side) so that the angular difference becomes 270 degrees.

Since the angle of a position at which the p-ohmic electrode 351 connected to the gate signal line (gate signal lines 55 to 58 and 65 to 68) is disposed is different between the VCSEL groups, the gate signal lines are provided through a space above the islands 301 (VCSELs). Therefore, the distance between VCSELs is shortened. Accordingly, the VCSELs are arranged at a high density in comparison with a case where the gate signal lines are not provided above the VCSELs.

Meanwhile, in a case where there is no angular difference between the position at which the p-ohmic electrode 351 connected to the gate signal line (gate signal lines 55 to 58 and 65 to 68) is disposed and the position at which the p-ohmic electrode 352 is disposed, the VCSELs are hindered from being arranged at a high density.

For example, in a case where the island 301A is used instead of the island 301B, connection to the p-ohmic electrode 351 cannot be performed even in a case where the gate signal line 65 is bent along the gate signal line 56 since the gate signal line 56 is present at a lower layer (substrate 80 side). In addition, in a case where the island 301B is used instead of the island 301A and the gate signal line 55 is bent along the gate signal line 65, the area of overlap between the gate signal line 55 and the gate signal line 65 increases, which may cause a decrease in manufacturing yield.

That is, in a case where there is an angular difference between the position at which the p-ohmic electrode 351 connected to the gate signal line (gate signal lines 55 to 58 and 65 to 68) is disposed and the position at which the p-ohmic electrode 352 is disposed, the VCSELs are arranged at a high density.

Details of the connection relationship of other islands will be described by using the cross-sectional structure of the light emitting device 4.

Cross-Sectional Structure of Light Emitting Device 4

Next, the cross-sectional structure of the light emitting device 4 will be described.

FIGS. 6A and 6B are cross-sectional views of the group of islands 301 provided with the setting thyristors S/VCSELs. FIG. 6A is a cross-sectional view taken along line VIA-VIA in FIG. 4 and FIG. 6B is a cross-sectional view taken along line VIB-VIB in FIG. 4. In FIG. 6A, a rightward direction of the paper surface is the direction x, an upward direction of the paper surface is the direction z, and a rear surface direction of the paper surface is the direction y. In FIG. 6B, a rightward direction of the paper surface is the direction y, an upward direction of the paper surface is the direction z, and a front surface direction of the paper surface is the direction x. FIG. 6A is a cross-sectional view of the first row of the group of islands 301 provided with the setting thyristors S/VCSELs and FIG. 6B is a cross-sectional view of the first column of the group of islands provided with the setting thyristors S/VCSELs in the case of an assumption that the rows are numbered toward the direction x side.

In FIG. 6A, the island 301A (S1/V1), the island 301B (S12/V12), the island 301A (S2/V2), and the island 301B (S16/V16) are shown in order from the left end. In FIG. 6A, the islands 301A and 301B alternate.

In FIG. 6B, the island 301A (S1/V1), the island 301B (S10/V10), the island 301A (S5/V5), and the island 301B (S9/V9) are shown in order from the left end. That is, in FIG. 6B as well, the islands 301A and 301B alternate.

The semiconductor layer laminate will be described by using the island 301B (S16/V16) at the right end of FIG. 6A. Regarding the semiconductor layer laminate, a p-type anode layer (p-anode layer) 81, a light emission layer 82, and an n-type cathode layer (n-cathode layer) 83 constituting the VCSELs are laminated on the p-type GaAs substrate 80. Then, a tunnel junction layer 84 is laminated on the n-cathode layer 83. Furthermore, a p-type anode layer (p-anode layer) 85, a voltage reduction layer 86, an n-type gate layer (n-gate layer) 87, the p-type gate layer (p-gate layer) 88, and the n-type cathode layer (n-cathode layer) 89 constituting the setting thyristors S are laminated on the tunnel junction layer 84. Then, the semiconductor layer laminates are separated for each of the islands 301 (islands 301A and 301B) through mesa etching.

A rear surface electrode 99 that supplies the reference potential Vsub is provided on a rear surface of the substrate 80.

In addition, the p-anode layer 81, the light emission layer 82, and the n-cathode layer 83 constitute the VCSELs. The p-anode layer 85, the voltage reduction layer 86, the n-gate layer 87, the p-gate layer 88, and the n-cathode layer 89 constitute the setting thyristors S. In addition, the VCSELs and the setting thyristors S are laminated with the tunnel junction layer 84 interposed therebetween.

An insulation layer 90 is provided on the islands 301 (islands 301A and 301B) and the light emission wire 54 is provided on the insulation layer 90. An insulation layer 91 is provided on the light emission wire 54 and the gate signal lines 55 to 58 are provided on the insulation layer 91. An insulation layer 92 is provided on the gate signal lines 55 to 58 and the gate signal lines 65 to 68 are provided on the insulation layer 92. The insulation layers 90 to 92 are formed of silicon oxide ($SiO_2$ or like), silicon nitride ($Si_3N_4$ or like), or the like. The wires such as the light emission wire 54, the gate signal lines 55 to 58, and the gate signal lines 65 to 68 and the rear surface electrode 99 are formed of metal such as gold (Au), aluminum (Al), copper (Cu), and silver (Ag) or formed of a metal alloy.

The p-anode layer 81 of a VCSEL includes a current constriction layer. The current constriction layer is a layer that narrows the path of a current flowing through the VCSEL. As the current constriction layer, for example, a layer in which $Al_2O_3$ is formed through oxidation of AlAs or the like to increase the electric resistance is used. As described above, each of the islands 301 (islands 301A and 301B) has a circular planar shape. Therefore, oxidation proceeds inward concentrically starting from a portion (peripheral portion) exposed because of the mesa etching. Then, the central portion is left in an unoxidized state. As a result, the central portion becomes a region where a current easily flows (current passage region α), and the oxidized peripheral portion becomes a region where a current does not easily flow (current inhibition region β). Non-radiative recombination is likely to occur at the peripheral portion with a large number of defects caused by the mesa etching. Therefore, since the peripheral portion becomes the current inhibition region β, power consumption in the non-radiative recombination is suppressed and thus it is possible to reduce power consumption and to improve the efficiency of light extraction. Note that the efficiency of light extraction is the amount of light that can be extracted per power.

Here, light emitted by the VCSELs passes through the setting thyristors S and is emitted to a side (direction +z side) opposite to the substrate 80. In FIGS. 6A and 6B, the emitted light is represented by arrows. The central portion of each island is the light emission port γ. Note that, a portion of the setting thyristor S that corresponds to the light emission port γ may be removed. In this case, the setting thyristor S is formed in a cylindrical shape. Accordingly, absorption of light emitted by the VCSEL caused by the setting thyristor S and a decrease in amount of light with which a measurement target is irradiated are suppressed.

As shown in FIG. 6A, in the case of the island 301B (S12/V12), the p-ohmic electrode 352 is provided in a region where the n-cathode layer 89 of the setting thyristor S12 is removed through etching and the p-gate layer 88 is exposed. The p-ohmic electrode 352 is connected to, via through-holes provided in the insulation layers 90 to 92, the gate signal line 66 (refer to FIG. 3) provided on the insulation layers 90 to 92. Similarly, in the case of the island 301B (S16/V16), the p-ohmic electrode 352 is connected to, via through-holes provided in the insulation layers 90 to 92, the gate signal line 68 (refer to FIG. 3) provided on the insulation layers 90 to 92.

Meanwhile, the island 301A (S1/V1) is not connected to the gate signal line 65 and the island 301A (S2/V2) is not connected to the gate signal line 67. This is because the island 301A (S1/V1) and the island 301A (S2/V2) are connected to the gate signal line 55 as shown in FIG. 6B (refer to FIG. 4).

As shown in FIG. 6B, in the case of the island 301A (S1/V1), the p-ohmic electrode 351 is provided in a region where the n-cathode layer 89 of the setting thyristor S1 is removed through etching and the p-gate layer 88 is exposed. The p-ohmic electrode 351 is connected to, via through-holes provided in the insulation layers 90 and 91, the gate signal line 55 (refer to FIG. 3) provided on the insulation layers 90 and 91. Similarly, in the case of the island 301A (S5/V5), the p-ohmic electrode 351 is connected to, via through-holes provided in the insulation layers 90 and 91, the gate signal line 57 (refer to FIG. 3) provided on the insulation layers 90 and 91.

Meanwhile, the island 301B (S10/V10) is not connected to the gate signal line 56 and the island 301B (S9/V9) is not connected to the gate signal line 58. This is because the island 301B (S10/V10) and the island 301B (S9/V9) are connected to the gate signal line 65 (refer to FIG. 4).

As described above, in the case of the islands 301A connected to the gate signal lines 55 to 58 extending in the direction x, the p-ohmic electrode 351 is disposed on a lower side (direction −y side), that is, at a position of 180 degrees. In the case of the islands 301B connected to the gate signal lines 65 to 68 extending in the direction y, the p-ohmic electrode 352 is disposed on a right side (direction +x side), that is, at a position of 90 degrees. Since positions where the p-ohmic electrodes 351 and the p-ohmic electrodes 352 are disposed are different between the VCSEL groups, gate signal wires are provided through a space above the VCSELs and the VCSELs are arranged at a high density.

In addition, the VCSELs provided in the islands 301A and the VCSELs provided in the islands 301B belong to different VCSEL groups. For example, the island 301A (S1/V1) and the island 301A (S2/V2) shown in FIG. 6A belong to the VCSEL group #1, the island 301B (S12/V12) belongs to the VCSEL group #6, and the island 301B (S16/V16) belongs to the VCSEL group #8. The island 301A (S1/V1) shown in FIG. 6B belongs to the VCSEL group #1, the island 301A (S5/V5) belongs to the VCSEL group #3, and the island 301B (S9/V9) and the island 301B (S10/V10) belong to the VCSEL group #5.

Figure 7:
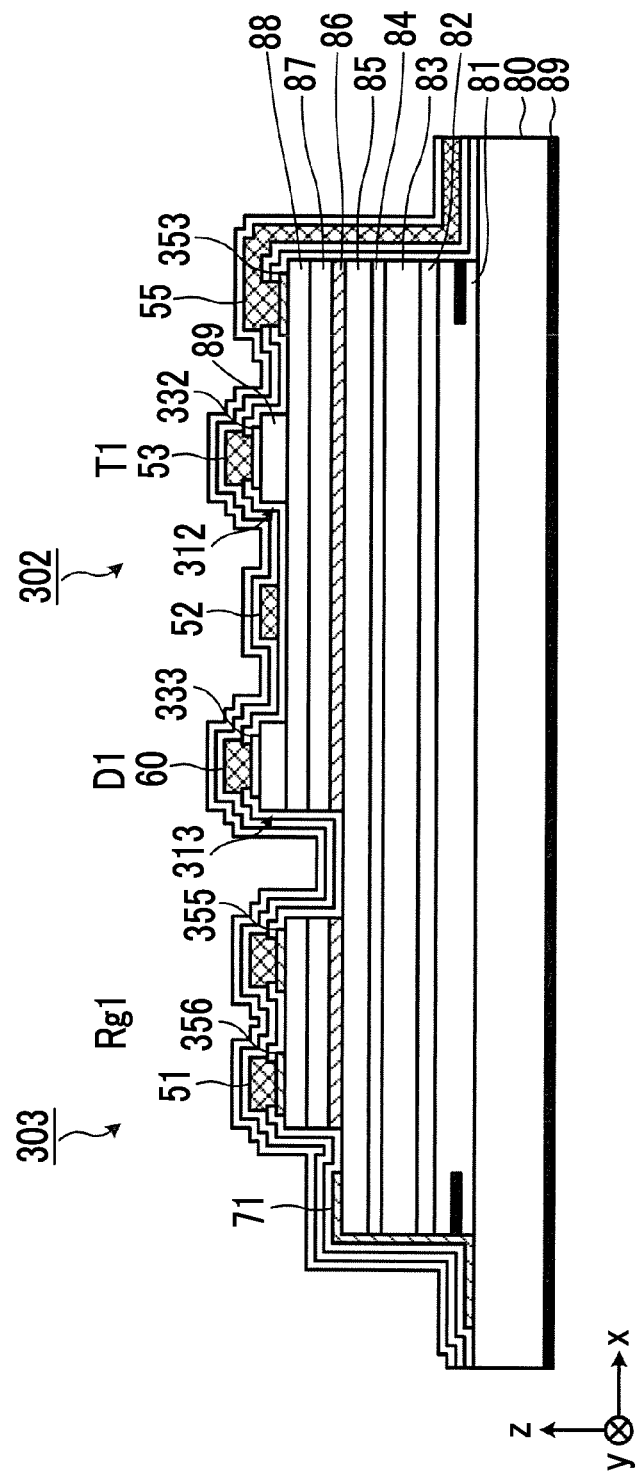
FIG. 7 is a cross-sectional view of an island provided with a transfer thyristor and a coupling diode and an island provided with a power line resistor.

FIG. 7 is a cross-sectional view of the island 302 provided with the transfer thyristor T1 and the coupling diode D1 and the island 303 provided with the power line resistor Rg1. FIG. 7 is a cross-sectional view taken along line VII-VII in FIG. 4. In FIG. 7, a rightward direction of the paper surface is the direction x, an upward direction of the paper surface is the direction z, and a rear surface direction of the paper surface is the direction y.

On the island 302, the coupling diode D1 and the transfer thyristor T1 are arranged in the direction x. The island 302 is composed of the p-anode layer 85, the voltage reduction layer 86, the n-gate layer 87, the p-gate layer 88, the n-cathode layer 89, the p-anode layer 81, the light emission layer 82, the n-cathode layer 83, and the tunnel junction layer 84. The p-anode layer 85, the voltage reduction layer 86, the n-gate layer 87, the p-gate layer 88, and the n-cathode layer 89 constitute the setting thyristor S1 of the islands 301, the p-anode layer 81, the light emission layer 82, and the n-cathode layer 83 constitute the VCSEL 1, and the tunnel junction layer 84 is provided between the n-cathode layer 83 and the p-anode layer 85. Note that the p-anode layer 81, the light emission layer 82, the n-cathode layer 83, the tunnel junction layer 84, and the p-anode layer 85 are left between the islands 302 to 306. Therefore, this portion will be referred to as an island 307. At this portion, the p-anode layer 85 and the substrate 80 are connected to each other by a wire 71 that easily makes an ohmic contact so that light emission attributable to the operation of a VCSEL is suppressed (refer to FIG. 4). The wire 71 is formed of the same member as the p-ohmic electrodes 351 and 352.

Hereinafter, the islands 302 to 306 will be described without description of the island 307.

The transfer thyristor T1 is composed of the n-cathode layer 89, the p-gate layer 88, the n-gate layer 87, the voltage reduction layer 86, and the p-anode layer 85. The n-cathode layer 89 is a cathode, the p-gate layer 88 is a gate, and the p-anode layer 85 is an anode. An n-ohmic electrode 332 provided on an n region 312 composed of the n-cathode layer 89 is a cathode terminal and a p-ohmic electrode 353 provided on the p-gate layer 88 exposed because of removal of the n-cathode layer 89 is a gate terminal. Furthermore, although not shown, the p-ohmic electrode 353 is provided on the p-gate layer 88 exposed because of removal of the n-cathode layer 89 (refer to FIG. 4).

The coupling diode D1 is composed of the n-cathode layer 89 and the p-gate layer 88. The n-cathode layer 89 is a cathode and the p-gate layer 88 is an anode. An n-ohmic electrode 333 provided on an n region 313 composed of the n-cathode layer 89 is a cathode terminal.

The island 303 is provided with the power line resistor Rg1. The island 303 includes the p-anode layer 85, the voltage reduction layer 86, the n-gate layer 87, and the p-gate layer 88. Note that the n-cathode layer 89 has been removed. In addition, p-ohmic electrodes 355 and 356 are provided on the p-gate layer 88. In addition, the p-gate layer 88 between the p-ohmic electrode 355 and the p-ohmic electrode 356 functions as a resistor. The current limiting resistors R1 and R2 respectively provided on the islands 305 and 306 have the same structure as the island 303.

Note that, although not shown, the start diode SD provided on the island 304 includes the p-anode layer 85, the voltage reduction layer 86, the n-gate layer 87, and the p-gate layer 88. As in the case of the coupling diode D1, the start diode SD is composed of the n-cathode layer 89 and the p-gate layer 88. The n-cathode layer 89 is a cathode and the p-gate layer 88 is an anode. An n-ohmic electrode 334 provided on an n region 314 composed of the n-cathode layer 89 is a cathode terminal and the p-ohmic electrode 356 provided on the p-gate layer 88 is an anode terminal (refer to FIG. 4).

A connection relationship will be described with reference to FIG. 4.

The p-ohmic electrode 353, which is the gate terminal of the transfer thyristor T1 of the island 302, is connected to a gate terminal (p-ohmic electrode 351) of each of the setting thyristor S1 of the island 301A (S1/V1) and the setting thyristor S2 of the island 301A (S2/V2) by the gate signal line 55. The n-ohmic electrode 332, which is the cathode terminal of the transfer thyristor T1, is connected to the transfer signal line 52. The p-ohmic electrode 356 of the power line resistor Rg1 provided on the island 303 is connected to the power line 51.

Although not shown in FIG. 7, a p-ohmic electrode 354 of the island 302 is connected to the p-ohmic electrode 355 of the power line resistor Rg1 provided on the island 303 and the n-ohmic electrode 334, which is the cathode terminal of the start diode SD provided on the island 304, by a wire 59 (refer to FIG. 4). The p-ohmic electrode 355 of the power line resistor Rg1 provided on the island 303 is connected to the p-ohmic electrode 354 of the island 302 (refer to FIG. 4). The n-ohmic electrode 333, which is a cathode terminal in the coupling diode D1 of the island 302, is connected to a p-ohmic electrode (with no reference numeral given thereto) provided on the p-gate layer 88 of an island (island similar to island 302) provided with the transfer thyristor T2 by a wire 60 (refer to FIG. 4).

Note that the semiconductor layer laminate shown in FIGS. 6A to 7 includes the tunnel junction layer 84 and the voltage reduction layer 86. The tunnel junction layer 84 and the voltage reduction layer 86 will be described.

Tunnel Junction Layer 84

The VCSELs and the setting thyristors S are laminated with the tunnel junction layer 84 interposed therebetween.

Accordingly, the VCSELs and the setting thyristors S are connected in series. In the islands 301 in which the VCSELs and the setting thyristors S are configured, the reference potential Vsub is supplied to the rear surface electrode 99 provided in the substrate 80 and the light emission signal φI is applied to the n-ohmic electrode 331 of the n-cathode layer 89 connected to the light emission wire 54. At this time, a voltage for forward bias is applied to each of the VCSELs and the setting thyristors S. In a case where no tunnel junction layer 84 is interposed, reverse bias occurs between the VCSELs and the setting thyristors S, which inhibits the flow of current.

The tunnel junction layer 84 is a junction between an $n^{++}$ layer to which an n-type impurity is added at a high concentration and a $p^{++}$ layer to which a p-type impurity is added at a high concentration to each other. In a case where the tunnel junction layer 84 is reverse-biased, potential Ev of a valence band on the $p^{++}$ layer side becomes higher than potential Ec of a conduction band on the $n^{++}$ layer side. Then, electrons are tunneled from the valence band of the $p^{++}$ layer to the conduction band on the $n^{++}$ layer side. The higher a reverse biasing voltage (−V) is, the easier it is for the electrons to be tunneled. That is, the larger the reverse bias is, the easier it is for currents to flow in the tunnel junction layer 84 (tunnel junction).

Accordingly, in a case where a voltage forward biasing the VCSELs and the setting thyristors S is applied and the setting thyristors S are turned on and transition into an ON state, currents flow from the VCSELs to the setting thyristors S even in a case where the tunnel junction layer 84 is reverse-biased.

Note that, instead of the tunnel junction layer 84, a group III-V compound layer having metallic conductivity and epitaxially growing on a group III-V compound semiconductor layer may also be used. In the case of InNAs described as an example of the material of a metallic conductive group III-V compound layer, the bandgap energy is negative, for example, in a case where an InN composition ratio x falls within a range of approximately 0.1 to approximately 0.8. Furthermore, in the case of InNSb, the bandgap energy is negative, for example, in a case where the InN composition ratio x falls within a range of approximately 0.2 to approximately 0.75. The bandgap energy being negative means that there is no bandgap. Accordingly, the same conductive characteristics (conduction characteristics) as metal are exhibited. That is, the meaning of metallic conductive characteristics (conductivity) is that a current flows in a case where potential has a gradient as in the case of metal.

The lattice constant of group III-V compounds (semiconductors) such as GaAs and InP is in a range of 5.6 Å to 5.9 Å. Similarly, the lattice constant of InN, which is a III-V compound, is approximately 5.0 Å in a zinc blende structure, and the lattice constant of InAs is approximately 6.06 Å. Accordingly, the lattice constant of InNAs, which is a compound of InN and InAs, can be close to 5.6 Å to 5.9 Å of GaAs and the like.

The lattice constant of InSb, which is a group III-V compound, is approximately 6.48 Å. Accordingly, the lattice constant of InNSb, which is a compound of InSb and InN, can be close to 5.6 Å to 5.9 Å of GaAs and the like since the lattice constant of InN is approximately 5.0 Å.

That is, InNAs and InNSb can be monolithically epitaxially grown on a layer of a group III-V compound (semiconductor) such as GaAs. Furthermore, a layer of a group III-V compound (semiconductor) such as GaAs can be monolithically laminated on a layer of InNAs or InNSb by means of epitaxial growth.

Accordingly, in a case where the setting thyristors S and the VCSELs are laminated with a metallic conductive group III-V compound interposed therebetween instead of the tunnel junction layer 84 such that the setting thyristors S and the VCSELs are connected in series, reverse bias of the n-cathode layer 83 of the VCSELs and the p-anode layer 85 of the setting thyristors S is suppressed.

Voltage Reduction Layer 86

The voltage reduction layer 86 is a layer having a smaller band gap energy than the p-anode layer 85, the n-gate layer 87, the p-gate layer 88, and the n-cathode layer 89 constituting the setting thyristors S and the transfer thyristors T. The turn-on voltage of the thyristors (setting thyristors S and transfer thyristors T) is determined by the smallest bandgap energy (bandgap energy) in the semiconductor layer laminate constituting the thyristors. Therefore, the turn-on voltage of a thyristor including the voltage reduction layer 86 is lower than the turn-on voltage of a thyristor including no voltage reduction layer 86. Note that, the turn-on voltage of a thyristor is a voltage related to a case where currents in a thyristor in an ON state are externally inserted into a voltage axis. Similarly, the maintenance voltage, which is a voltage at which the ON state of a thyristor maintained, of a thyristor including the voltage reduction layer 86 is lower than the maintenance voltage of a thyristor including no voltage reduction layer 86.

The lattice constant of GaAs is approximately 5.65 Å. The lattice constant of AlAs is approximately 5.66 Å. Accordingly, a material having a lattice constant close to these lattice constants can be epitaxially grown on a GaAs substrate. For example, AlGaAs, which is a compound of GaAs and AlAs, or Ge can be epitaxially grown on a GaAs substrate. Ge has a bandgap energy of approximately 0.67 eV while GaAs has a bandgap energy of approximately 1.43 eV. Therefore, in a case where Ge or the like having a smaller bandgap energy than GaAs is used as the voltage reduction layer 86, the turn-on voltage and the maintenance voltage of a thyristor are reduced.

In FIGS. 6A to 7, the voltage reduction layer 86 is provided between the p-anode layer 85 and the n-gate layer 87. However, the voltage reduction layer 86 may be provided between the n-gate layer 87 and the p-gate layer 88 and may be provided between the p-gate layer 88 and the n-cathode layer 89. In addition, a plurality of voltage reduction layers 86 may be provided therebetween and one voltage reduction layer 86 may be provided in the n-gate layer 87 with another voltage reduction layer 86 provided in the p-gate layer 88. In addition, the voltage reduction layer 86 may be provided in each of two or three of the p-anode layer 85, the n-gate layer 87, the p-gate layer 88, and the n-cathode layer 89. The conduction type of these voltage reduction layers may be combined with the conduction type of an anode layer, a cathode layer, and a gate layer provided with the voltage reduction layers or may be i type.

Note that the voltage reduction layer 86 may not be used.

Since the light emitting device 4 can be manufactured by means of a known technique such as photolithography or etching, the description of a method of manufacturing the light emitting device 4 will be omitted.

Operation of Laminated Setting Thyristor S and VCSEL

Next, the operation of the setting thyristor S and the VCSEL that are laminated will be described.

Here, it will be assumed that the turn-on voltage of the VCSEL is 1.5 V. The VCSEL emits light when a voltage of 1.5 V or more is applied between the anode and the cathode.

The light emission signal φI is 0 V ("H (0 V)") or −3.3 V ("L (−3.3 V)"). 0 V is a potential to cause the VCSEL to transition into an OFF state and −3.3 V is a potential to cause the VCSEL to transition into an ON state from the OFF state.

In a case where 0 V is applied to the gate Gs of the setting thyristor S, the threshold value of the setting thyristor S becomes −1.5 V which is obtained by subtracting a forward potential Vd (1.5 V) of a pn junction from the potential (0 V) of the gate Gs. In a case where the light emission signal φI is set to "L (−3.3 V)" from "H (0 V)" in this state, the setting thyristor S is turned on and transitions into an ON state from an OFF state, a current flows into the VCSEL, and light is emitted. Since a voltage (maintenance voltage) to be applied to the setting thyristor S in the ON state only has to be 1.5 V or more, a voltage close to 1.8 V is applied to the VCSEL. Since the turn-on voltage of the VCSEL is 1.5 V, the VCSEL continues to emit light.

Meanwhile, in a case where the light emission signal φ$^I$ transitions to "H (0 V)" from "L (−3.3 V)", both ends of series connection between the VCSEL and the setting thyristor S reach 0 V, the setting thyristor S transitions into the OFF state from the ON state (is turned off), and light emission of the VCSEL is stopped.

Timing Chart

Figure 8:
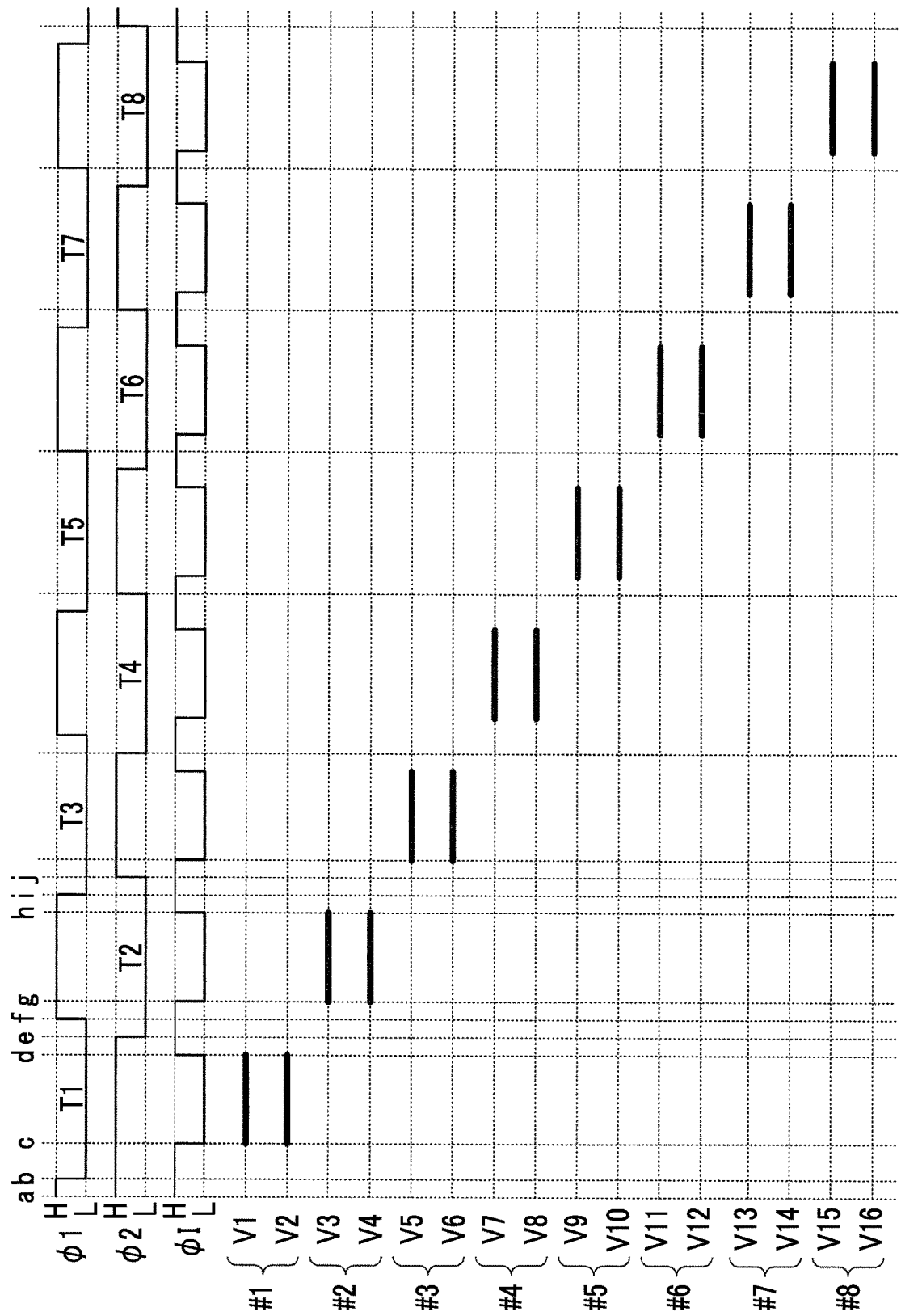
FIG. 8 is a diagram showing an example of a timing chart for light emission/non-light emission control of VCSEL groups in the light emitting device.

FIG. 8 is a diagram showing an example of a timing chart for light emission/non-light emission control of the VCSEL groups in the light emitting device 4. Here, a case where each of the eight VCSEL groups described with reference to FIG. 3 includes two VCSELs will be described as an example. It will be assumed that time elapses in alphabetical order (a, b, c, . . . and so forth) in FIG. 8.

The timing chart of FIG. 8 will be described with reference to FIG. 3.

First, the waveform of each signal (transfer signals φ1 and φ2 and light emission signal φI) will be described.

The transfer signal φ1 is a signal set to "H (0 V)" or "L (−3.3 V)". The transfer signal φ1 is "H (0 V)" at time a and transitions to "L (−3.3 V)" at time b. Then, at time f, the transfer signal φ1 returns to "H (0 V)". Then, at time i, the transfer signal φ1 transitions to "L (−3.3 V)" again. The transfer signal φ1 is a signal of which one cycle is a period from time b to time i.

The transfer signal φ2 is also a signal set to "H (0 V)" or "L (−3.3 V)". The transfer signal φ2 is "H (0 V)" at time a and transitions to "L (−3.3 V)" at time e. Then, at time j, the transfer signal φ2 returns to "H (0 V)". The transfer signal φ2 is a signal obtained by shifting time b of the transfer signal φ1 to time e. The phases of the transfer signal φ1 and the transfer signal φ2 are 180 degrees off each other.

The light emission signal φI is a signal set to "H (0 V)" or "L (−3.3 V)". The light emission signal φI is "H (0 V)" at time a and transitions to "L (−3.3 V)" at time c. Then, at time d, the light emission signal φI transitions to "H (0 V)". Furthermore, at time g, the light emission signal φI transitions to "L (−3.3 V)". Then, at time h, the light emission signal φI transitions to "H (0 V)". That is, the light emission signal φI transitions to "L (−3.3 V)" in a period in which the transfer signal φ1 or the transfer signal φ2 is "L (−3.3 V)".

FIG. 8 shows the transfer thyristors T in an ON state with the waveforms of the transfer signals φ1 and φ2.

At time a, power is supplied to the light emission control unit 100 shown in FIG. 3, the reference potential Vsub is set to "H (0 V)", and the power potential Vgk is set to "L (−3.3 V)". Then, the transfer signals φ1 and φ2 are set to "H (0 V)". Regarding the start diode SD, the cathode reaches the power potential Vgk ("L (−3.3 V)") via the power line resistor Rg1 and the anode reaches the transfer signal φ2 "H (0 V)" via the current limiting resistor R2. Accordingly, the start diode SD is forward-biased and the gate Gt1 of the transfer thyristor T1 reaches −1.5 V. Accordingly, the threshold voltage of the transfer thyristor T1 becomes −3 V.

At time b, the transfer signal φ1 transitions to "L (−3.3 V)" from "H (0 V)". Since the threshold voltage of the transfer thyristor T1 is −3 V, the transfer thyristor T1 is turned on and transitions to an ON state from an OFF state. Then, the gate Gt1 reaches 0 V. Accordingly, the gates Gs1 and Gs2 of the setting thyristors S1 and S2 connected to the gate Gt1 reach 0 V. Then, the threshold voltage of the setting thyristors S1 and S2 becomes −1.5 V. At time b, the light emission signal φI is "H (0 V)". That is, 0 V is applied to series connection between the setting thyristor S1 and the VCSELs 1 and 2 (V1 and V2). Accordingly, the setting thyristor S1 is in an OFF state and the VCSELs 1 and 2 (V1 and V2) do not emit light.

Note that, since the gate Gt2 of the transfer thyristor T2 connected by the coupling diode D1 reaches −1.5 V, the threshold voltage of the transfer thyristor T2 becomes −3 V.

In a case where the light emission signal φI transitions to "L (−3.3 V)" from "H (0 V)" at time c, the setting thyristors S1 and S2 of which the threshold voltage is −1.5 V are turned on and transition into an ON state from an OFF state, a current flows into the VCSELs 1 and 2 (V1 and V2), and light is emitted. As described above, a voltage between a cathode and an anode of the setting thyristors S1 and S2 becomes 1.5 V, and a voltage between a cathode and an anode of the VCSELs 1 and 2 (V1 and V2) becomes 1.8 V. Accordingly, light emission of the VCSELs 1 and 2 (V1 and V2) is maintained. That is, at time c, the VCSELs 1 and 2 (V1 and V2) belonging to the VCSEL group #1 emit light in parallel.

In a case where the light emission signal φI transitions to "H (0 V)" from "L (−3.3 V)" at time d, both ends of series connection between the VCSEL 1 (V1) and the setting thyristor S1 and both ends of series connection between the VCSEL 2 (V2) and the setting thyristor S2 reach 0 V, the setting thyristors S1 and S2 are turned off and transition into an OFF state from an ON state, and light emission of the VCSELs 1 and 2 (V1 and V2) is stopped. That is, at time d, light emission of the VCSEL 1 (V1) and the VCSEL 2 (V2) belonging to the VCSEL group #1 is stopped in parallel. The threshold voltage of the setting thyristor S1 is maintained at −3 V.

In a case where the transfer signal φ2 transitions to "L (−3.3 V)" from "H (0 V)" at time e, the transfer thyristor T2 of which the threshold voltage is −3 V is turned on and transitions to an ON state from an OFF state. Then, as in the case of time b, the threshold voltage of the setting thyristors S3 and S4 becomes −1.5 V.

In a case where the transfer signal φ1 transitions to "H (0 V)" from "L (−3.3 V)" at time f, the anode and the cathode of the transfer thyristor T1 reach 0 V and the transfer thyristor T1 transitions to the OFF state from the ON state.

In a case where the light emission signal φI transitions to "L (−3.3 V)" from "H (0 V)" at time g, as in the case of time c, the setting thyristors S3 and S4 of which the threshold voltage is −1.5 V are turned on and transition into an ON state from an OFF state, a current flows into the VCSELs 3 and 4 (V3 and V4), and light is emitted. At time g, the VCSELs 3 and 4 (V3 and V4) belonging to the VCSEL group #2 emit light in parallel.

In a case where the light emission signal φI transitions to "H (0 V)" from "L (−3.3 V)" at time h, the setting thyristors S3 and S4 are turned off and transition into the OFF state from the ON state and light emission of the VCSELs 3 and 4 (V3 and V4) is stopped.

The transfer thyristor T3 is turned on at time i and the transfer thyristor T2 is turned off at time j. Thereafter, events as described above are repeated. That is, the VCSEL groups #1 to #8 that emit light are switched by means of transfer of the ON state of the transfer thyristors T1 to T8. The light emitting device 4 performs fractionated irradiation in this way.

Hereinafter, modification examples of the light emitting device 4 to which the present exemplary embodiment is applied will be described.

Modification Example 1

In the light emitting device 4 to which the present exemplary embodiment is applied, a position at which an electrode (p-ohmic electrodes 351 and 352) connected to a gate signal line is disposed with respect to the center O is different between VCSELs belonging to different VCSEL groups. For example, as shown in FIG. 5, the p-ohmic electrode 351 of the island 301A (S1/V1) provided with the VCSEL 1 belonging to the VCSEL group #1 is disposed at a position of 180 degrees with respect to the center O. On the other hand, the p-ohmic electrode 352 of the island 301B (S10/V10) provided with the VCSEL 10 belonging to the VCSEL group #5 is disposed at a position of 90 degrees with respect to the center O. That is, there is an angular difference of 90 degrees between the position at which the p-ohmic electrode 351 is disposed and the position at which the p-ohmic electrode 352 is disposed.

In addition, the n-ohmic electrodes 331 provided on the n-cathode layers 89 of the setting thyristors S, which are light emission electrodes supplying light emission currents to VCSELs, of the island 301A (S1/V1) and the island 301B (S10/V10) are disposed at positions of −45 degrees (315 degrees).

The light emitting device 4 of Modification Example 1 is different in configurations of the islands 301A and 301B shown in FIG. 5. Therefore, in Modification Example 1, islands 301A-1 and 301B-1 will be described.

Figure 9:
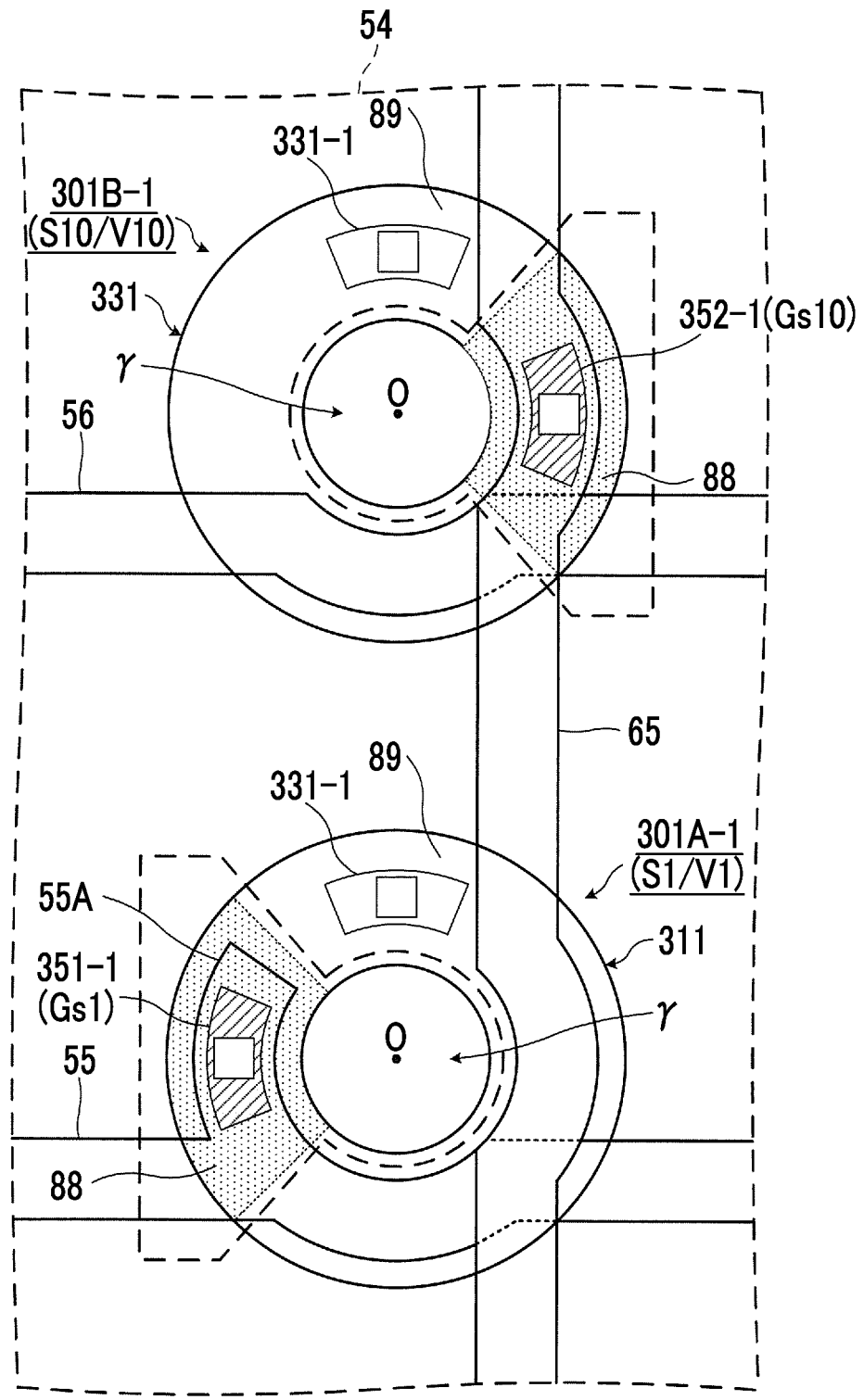
FIG. 9 is an enlarged plan view of two islands provided with setting thyristors/VCSELs in Modification Example 1.

FIG. 9 is an enlarged plan view of two islands 301A-1 (S1/V1) and 301B-1 (S10/V10) provided with setting thyristors S/VCSELs in Modification Example 1. Differences between the islands 301A-1 (S1/V1) and 301B-1 (S10/V10) and the islands 301A and 301B shown in FIG. 5 will be described and description of the same parts will be omitted with the same reference numerals given thereto.

In the island 301A-1 (S1/V1), an n-ohmic electrode 331-1 is provided on the n region 311 of the n-cathode layer 89. The n-ohmic electrode 331-1 is disposed on an upper side (direction +y side), that is, at a position of 0 degrees. The n-ohmic electrode 331-1 is a light emission electrode that is connected to the light emission wire 54 and supplies a light emission current to the VCSEL 1 (V1).

A p-ohmic electrode 351-1 is provided on the p-gate layer 88. The p-ohmic electrode 351-1 is disposed on a left side (direction −x side), that is, at a position of 270 degrees with respect to the center O. A branch gate signal line 55A that branches off from the gate signal line 55 in the direction y is provided so that the p-ohmic electrode 351-1 is connected to the gate signal line 55 extending in the direction x. In addition, the p-ohmic electrode 351-1 is connected to the branch gate signal line 55A.

As in the case of the island 301A-1 (S1/V1), the n-ohmic electrode 331-1 of the island 301B-1 (S10/V10) is disposed on the upper side (direction +y side), that is, at a position of 0 degrees. The n-ohmic electrode 331-1 is connected to the light emission wire 54.

A p-ohmic electrode 352-1 is provided on the p-gate layer 88. As in the case of the island 301B (S10/V10) shown in FIG. 5, the p-ohmic electrode 352-1 is disposed on a right side (direction +x side), that is, at a position of 90 degrees with respect to the center O. The p-ohmic electrode 352-1 is connected to the gate signal line 65 extending in the direction y.

As described above, a position at which the p-ohmic electrode 351-1 connected to the gate signal line 55 connected to the island 301A-1 (S1/V1) belonging to the VCSEL group #1 is disposed and a position at which the p-ohmic electrode 352-1 connected to the gate signal line 65 connected to the island 301B-1 (S10/V10) belonging to the VCSEL group #5 is disposed are different from each other. In addition, the angle with respect to the center O of the p-ohmic electrode 351-1 and the angle with respect to the center O of the p-ohmic electrode 352-1 are 270 degrees and 90 degrees respectively and are different from each other with an angular difference of 180 degrees.

In a case where the p-ohmic electrode 351-1 of the island 301A-1 is disposed at a position of 270 degrees, the gate signal line 55 may be provided with the branch gate signal line 55A. In FIG. 9, the branch gate signal line 55A is provided to face the gate signal line 65 with respect to the center O of the island 301A-1.

In Modification Example 1 as well, the gate signal line 55 and the branch gate signal line 55A connected to the island 301A-1 (S1/V1) belonging to the VCSEL group #1 extend around the light emission port γ on the island 301A-1 (S1/V1) and are provided in an arc shape on an edge portion of the island 301A-1 (S1/V1) having a cylindrical shape. In addition, the gate signal line 65 that is not connected to the island 301A-1 (S1/V1) also extends around the light emission port γ on the island 301A-1 (S1/V1) and is provided in an arc shape on an edge portion of the island 301A-1 (S1/V1) having a cylindrical shape. That is, the gate signal line 55 and the gate signal line 65 are provided on a VCSEL which is a light emitting element.

Note that, in a case where angular differences are 90 degrees, 180 degrees, and 270 degrees, the first line (here, gate signal lines 55 and 56 or like) and the second line (here, gate signal line 65 or like) are easily provided in comparison with the case of another angular difference.

Modification Example 2

In the light emitting device 4 of Modification Example 1, as shown in FIG. 9, each of the islands 301A-1 and 301B-1 includes one n-ohmic electrode 331-1 that is connected to the light emission wire 54.

The light emitting device 4 of Modification Example 2 is different in configurations of the islands 301A-1 and 301B-1 and the gate signal lines 55, 56, and 65 in Modification Example 1 shown in FIG. 9. Therefore, in Modification Example 2, islands 301A-2 and 301B-2 and gate signal lines 55-2, 56-2 and 65-2 will be described.

Figure 10:
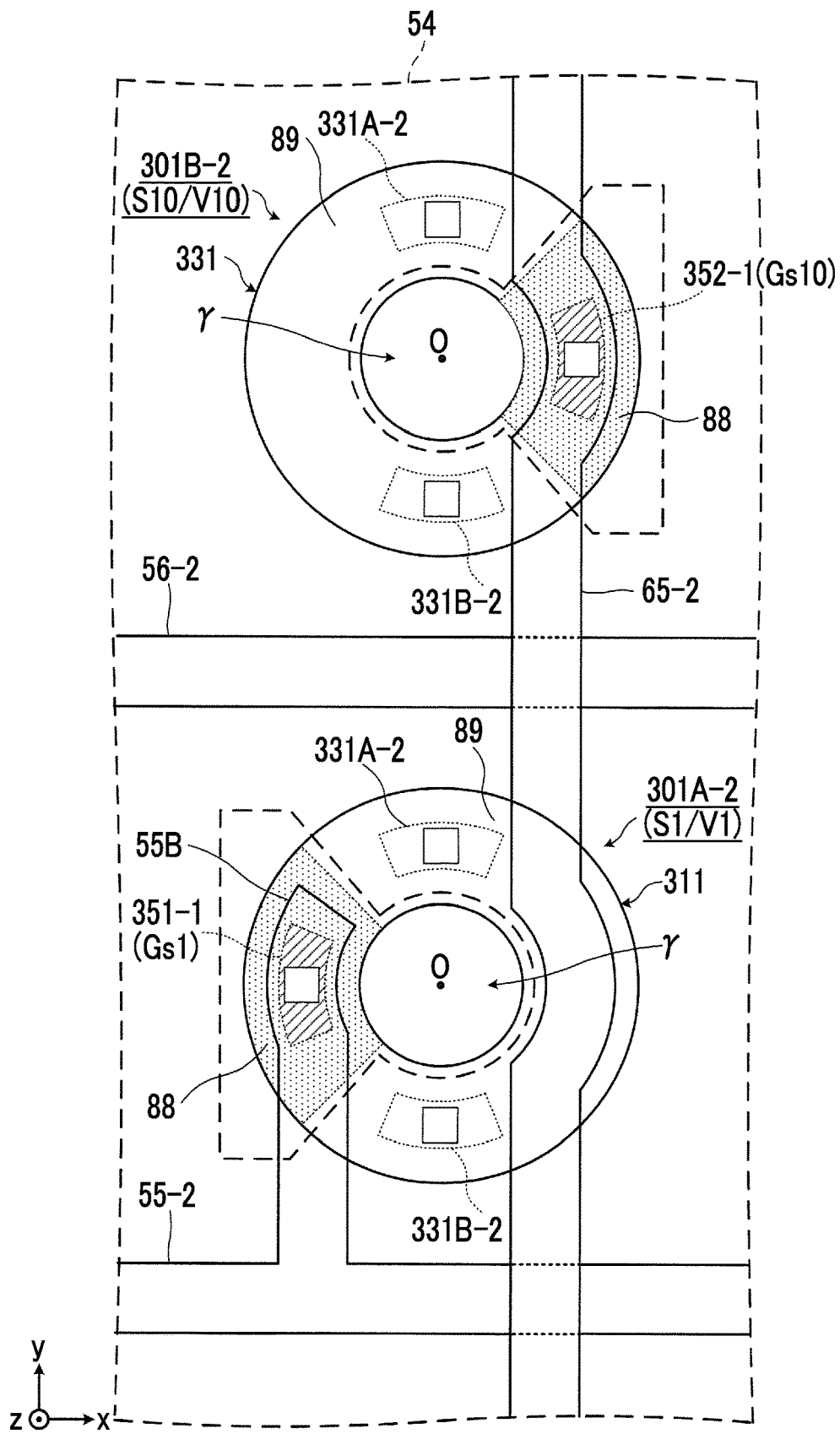
FIG. 10 is an enlarged plan view of two islands provided with setting thyristors/VCSELs in Modification Example 2.

FIG. 10 is an enlarged plan view of two islands 301A-2 (S1/V1) and 301B-2 (S10/V10) provided with setting thyristors S/VCSELs in Modification Example 2. Differences between the islands 301A-2 (S1/V1) and 301B-2 (S10/V10) and the islands 301A-1 and 301B-1 shown in FIG. 9 will be described and description of the same parts will be omitted with the same reference numerals given thereto.

In the island 301A-2 (S1/V1), n-ohmic electrodes 331A-2 and 331B-2 are provided on the n region 311 of the n-cathode layer 89. The n-ohmic electrode 331A-2 is the same as the n-ohmic electrode 331-1 of Modification Example 1 shown in FIG. 9. The n-ohmic electrode 331A-2 is disposed on an upper side (direction +y side), that is, at a position of 0 degrees with respect to the center O. The n-ohmic electrode 331B-2 is disposed on a lower side (direction −y side), that is, at a position of 180 degrees with respect to the center O. The n-ohmic electrodes 331A-2 and 331B-2 are connected to the light emission wire 54. The n-ohmic electrodes 331A-2 and 331B-2 are light emission electrodes that supply a light emission current to the VCSEL 1 (V1).

The gate signal line 55-2 is provided on the lower side (direction −y side) of the island 301A-2 (S1/V1). The gate signal line 55-2 is provided not through a space above the island 301A-2 (S1/V1). The gate signal line 65-2 is provided through a space above the island 301A-2 (S1/V1) as in the case of Modification Example 1 shown in FIG. 9.

The p-ohmic electrode 351-1 is provided in the same manner as in Modification Example 1 shown in FIG. 9. In addition, the p-ohmic electrode 351-1 is connected to the gate signal line 55-2 via a branch gate signal line 55B that branches off from the gate signal line 55-2.

In the island 301B-2 (S10/V10), the n-ohmic electrodes 331A-2 and 331B-2 are provided in the same manner as in the island 301A-2 (S1/V1).

The p-ohmic electrode 352-1 is provided in the same manner as in Modification Example 1 shown in FIG. 9. The p-ohmic electrode 352-1 is connected to the gate signal line 65-2 provided through a space above the island 301B-2 as in the case of Modification Example 1 shown in FIG. 9.

Even in this case, the n-ohmic electrodes 331A-2 and 331B-2 of the island 301A-2 (S1/V1), which are light emission electrodes that supply light emission currents, are provided between the gate signal line 55-2 and the gate signal line 65-2 and the n-ohmic electrodes 331A-2 and 331B-2 of the island 301B-2 (S10/V10), which are light emission electrodes that supply light emission currents, are also provided between the gate signal line 56-2 and the gate signal line 65-2. The same applies to the other of the islands 301A and 301B.

As described above, a plurality of light emission electrodes (for example, n-ohmic electrodes 331) supplying light emission currents may be provided for each island 301, that is, for each VCSEL which is an example of a light emitting element. In a case where a plurality of light emission electrodes supplying light emission currents are provided, concentration of currents on one place is suppressed in comparison with a case where one light emission electrode is provided, and a large current is easily supplied.

In Modification Example 2, gate signal lines (for example, gate signal lines 55-2 and 56-2 or like) extending in the direction x are provided between light emitting elements (here, VCSELs) instead of being provided above the light emitting elements. Accordingly, the n-ohmic electrode 331B-2 and the gate signal line 55-2 are prevented from overlapping each other. Meanwhile, a gate signal line (for example, gate signal line 65-2 or like) extending in the direction y is provided through a space above a light emitting element. Accordingly, the light emitting elements are arranged at a high density in the direction x although the light emitting elements are not arranged at a high density in the direction y.

Modification Example 3

In the case of the light emitting device 4 to which the present exemplary embodiment shown in FIG. 5 is applied, light is emitted toward a front surface side (direction z side in FIGS. 6A and 6B) of the substrate 80. Such light emission will be referred to as front surface emission.

In the case of the light emitting device 4 of Modification Example 3, light is emitted to a rear surface side (direction −z side in FIGS. 6A and 6B) of the substrate 80. Such light emission will be referred to as rear surface emission, as opposed to the front surface emission. In this case, a light emission portion is removed from the rear surface electrode 99 provided on the rear surface of the substrate 80.

The configurations of the gate signal lines of the light emitting device 4 of Modification Example 3 are different from the configurations of the gate signal lines shown in FIGS. 3 and 5. Therefore, in Modification Example 3, the gate signal lines will be described.

Figure 11:
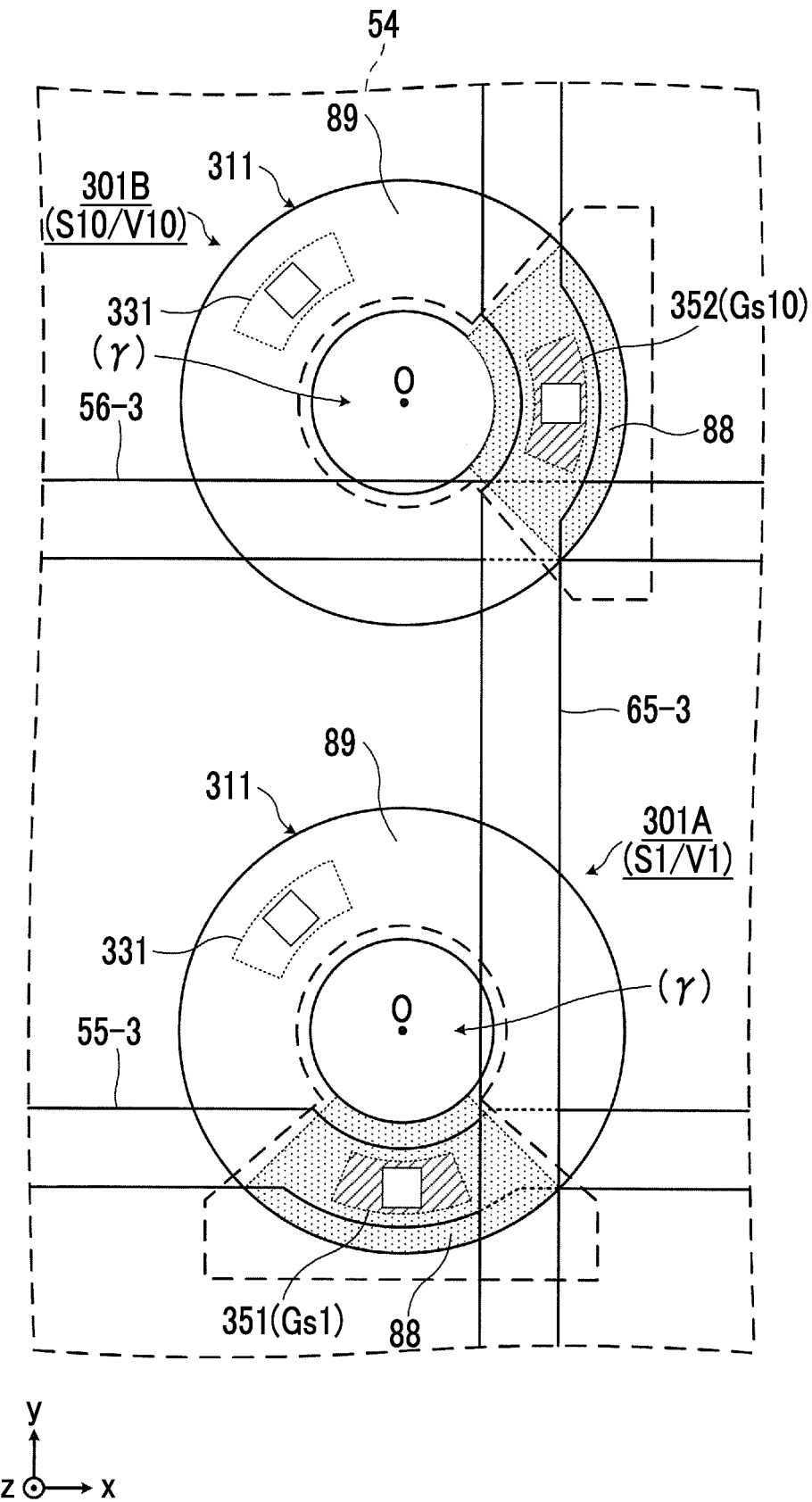
FIG. 11 is an enlarged plan view of two islands provided with setting thyristors/VCSELs in Modification Example 3.
Figure 12:
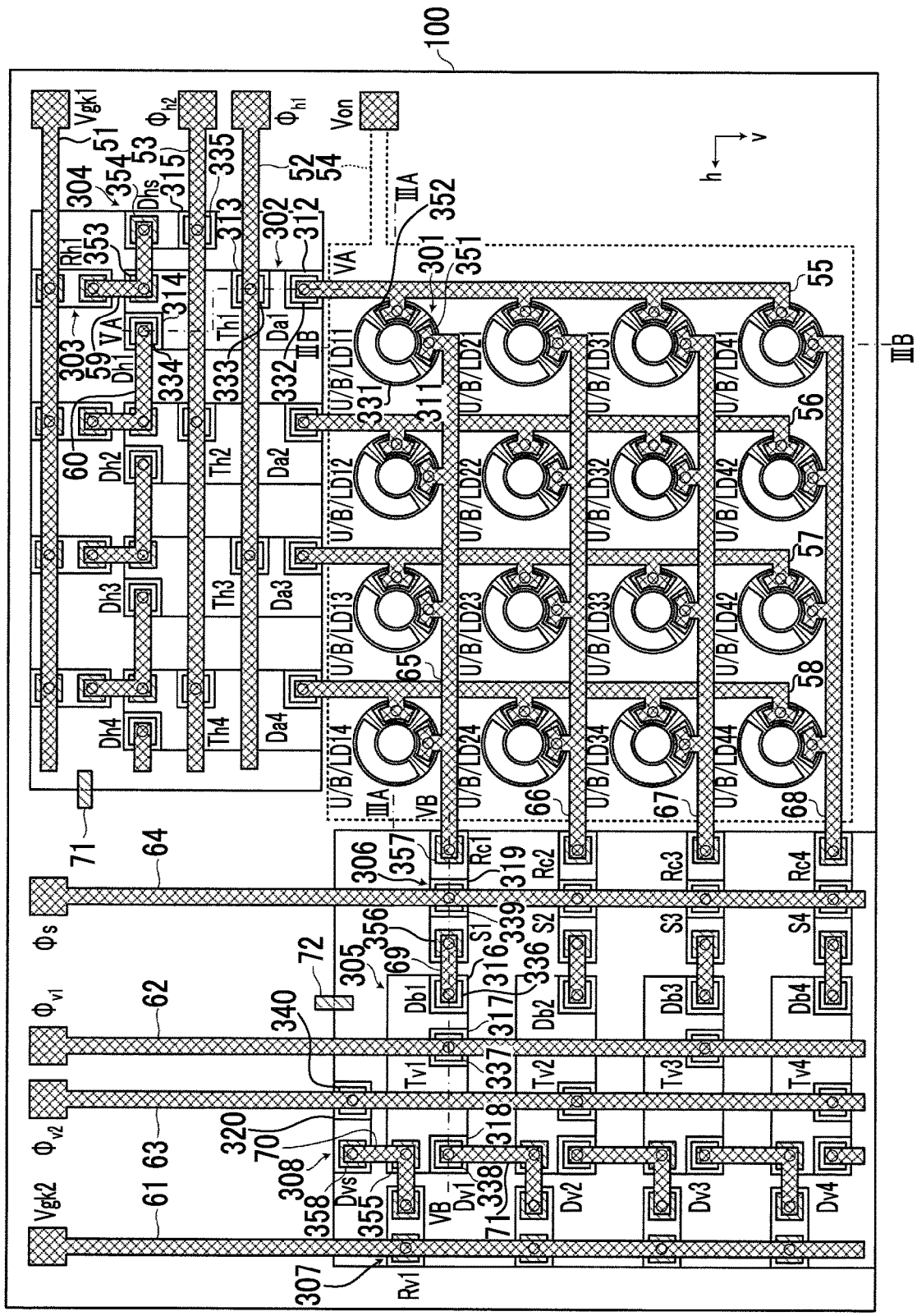
FIG. 12 is a view showing the planar layout of a light emission unit (Related Art Example 1), which is FIG. 2 in JP2020-35879A.
Figure 13:
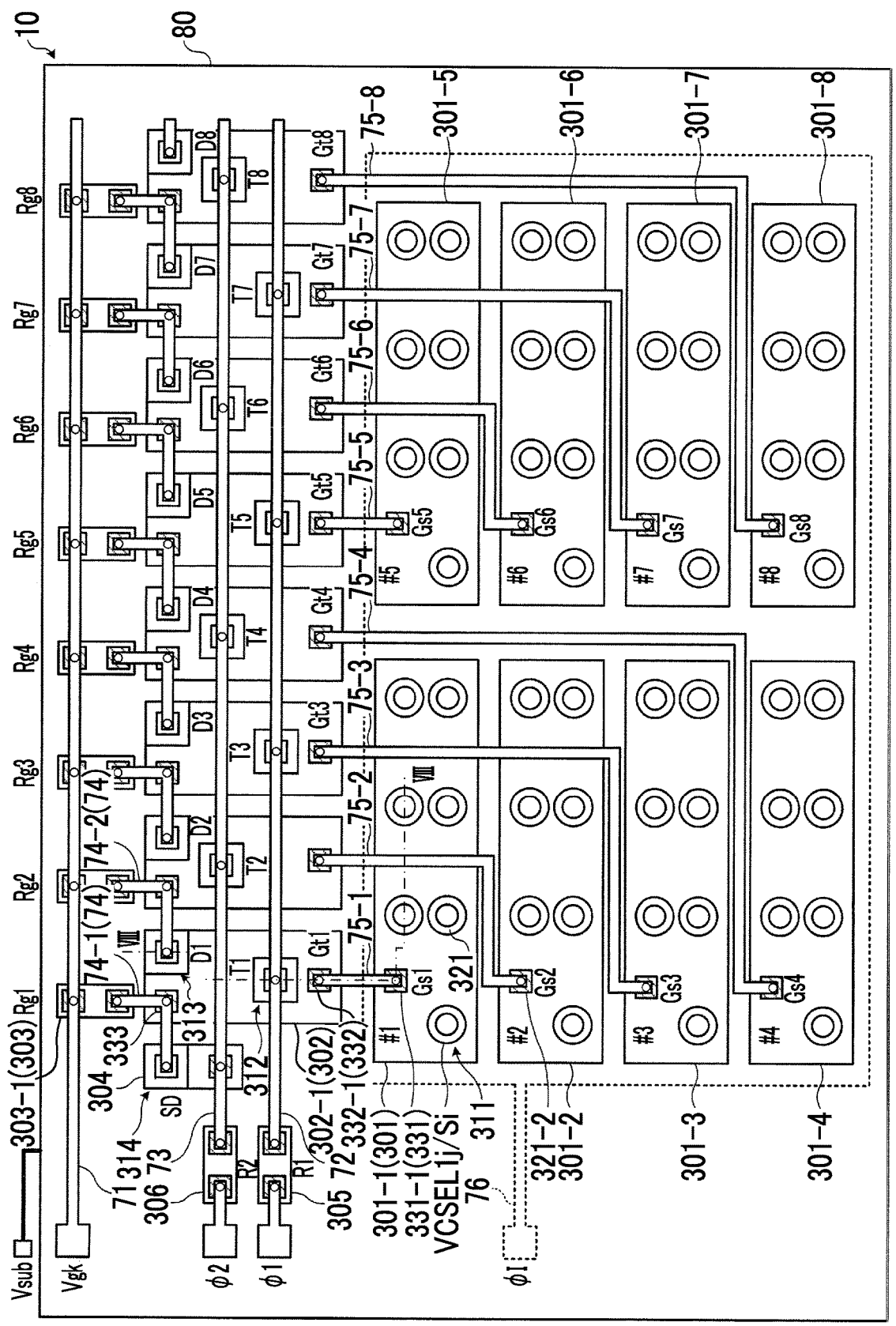
FIG. 13 is a view showing the planar layout of a VCSEL array (Related Art Example 2), which is FIG. 7 in JP2021-150651A.

FIG. 11 is an enlarged plan view of two islands 301A (S1/V1) and 301B (S10/V10) provided with setting thyristors S/VCSELs in Modification Example 3. Difference between the islands 301A (S1/V1) and 301B (S10/V10) and the islands 301A and 301B shown in FIG. 5 will be described and description of the same parts will be omitted with the same reference numerals given thereto.

As shown in FIG. 11, in Modification Example 3, the configurations of gate signal lines 55-3, 56-3, and 65-3 are different from the configurations of the gate signal lines 55, 56, and 65 shown in FIG. 5. Other configurations are similar to configurations shown in FIG. 5.

The gate signal line 56-3 that is not connected to the island 301B and extends in the direction x is provided linearly so as not to extend around a portion (represented by "(γ)" in FIG. 11 since rear surface emission is performed) corresponding to the light emission port γ on the island 301B. Since the rear surface emission is performed, the gate signal line 56-3 does not need to be provided avoiding the light emission port γ. Similarly, the gate signal line 65-3 not connected to the island 301A is provided linearly on the island 301A without bypassing the portion corresponding to the light emission port γ. The same applies to the other of the gate signal lines. Accordingly, the gate signal lines are shortened and the speed of transmission of signals is made high.

Modification Example 3 May be Applied to Modification Example 1 and Modification Example 2

In the above-described exemplary embodiment, the transfer unit 11 is provided at two places around the group of islands 301, the group of islands 301 being a region where VCSELs, which are light emitting elements, are provided. However, the transfer unit 11 may be provided at one place. For example, in FIG. 4, the islands provided with the transfer thyristors T5 to T8 (islands similar to island 302) and the islands provided with the power line resistors Rg5 to Rg8 (islands similar to island 303) may be provided on the direction −x side of the group of islands 301. Such islands may be provided in parallel with the island 302 and the island 303. In a case where the transfer unit 11 is provided at one place, it is easy to reduce the size of the light emitting device 4.

In the present exemplary embodiment, an example in which the VCSELs, which are light emitting elements, are provided on the substrate 80 and the setting thyristors S are provided on the VCSELs has been described. The setting thyristors S may be provided on the substrate 80 and the VCSELs which are light emitting elements may be provided on the setting thyristors S.

In addition, although an example in which light emitting elements are VCSELs has been described, the light emitting elements may be surface emission light emitting diodes (LED).

Furthermore, although an example in which the substrate 80 is a p-type substrate has been described, the substrate may be an n-type substrate and may be an insulating or semi-insulating substrate. In a case where the substrate is an n-type substrate, the substrate may be driven with the polarity reversed.

In the present exemplary embodiment, an example of switching light emitting element groups (VCSEL groups) that emit light by means of the transfer thyristors T has been described. Light emission may be switched between the light emitting element groups by using another method such as a method of using a shift register instead of the transfer thyristors T. In this case, the first line only has to be a line that controls light emission of light emitting elements of a first light emitting element group and the second line only has to be a line that controls light emission of light emitting elements of a second light emitting element group.

Figure 14:
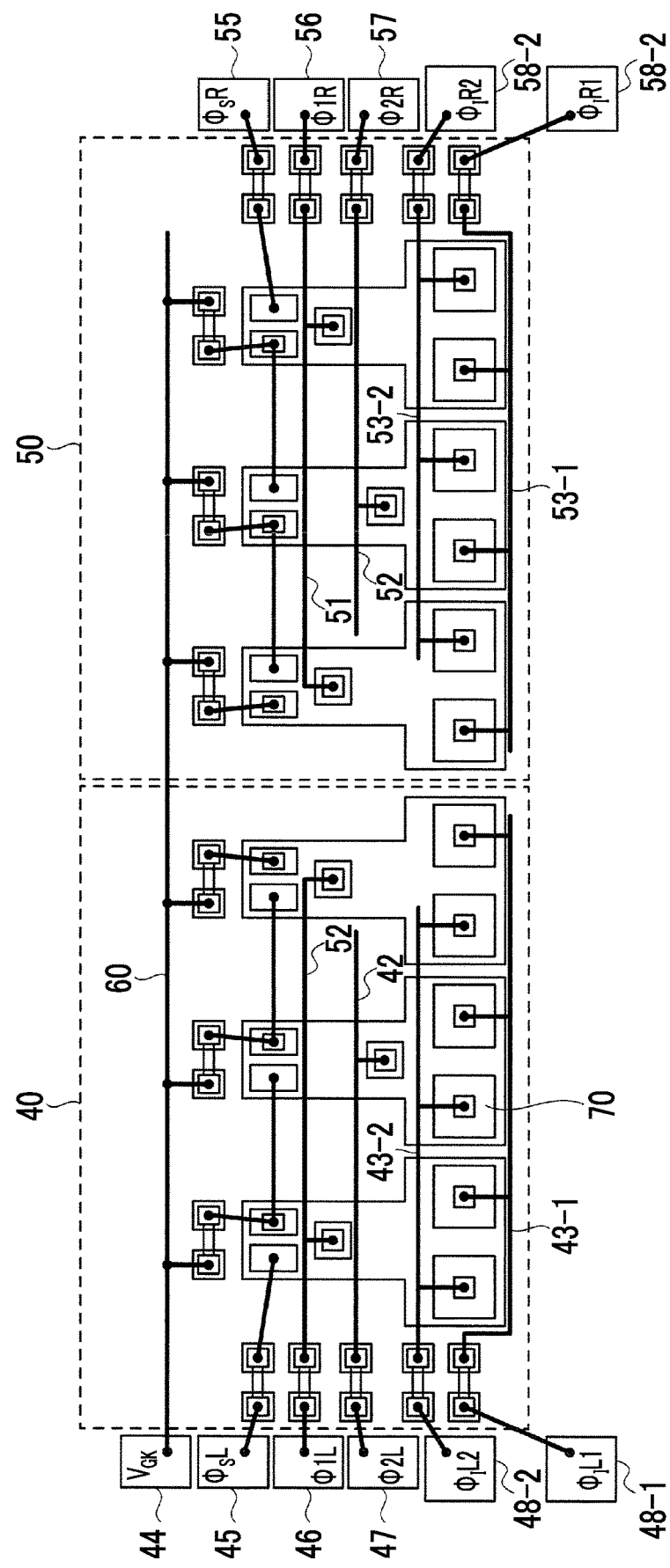
FIG. 14 is a plan view of a self-scanning light emitting element array chip (Related Art Example 3), which is FIG. 19 in JP2002-111063A.

Furthermore, in the present exemplary embodiment, a case where the first line and the second line vertically intersect each other vertically has been described. However, the first line and the second line may extend in other directions. For example, as in the case of Related Art Example 3 (see FIG. 14), wires connected to light emitting elements may be parallel to each other. In this case, as shown in Related Art Example 3, for example, a first electrode and a second electrode may be disposed with respect to a line connecting the centers of the light emitting elements with an angular difference of 180 degrees. Accordingly, for example, focusing only on a left side circuit 40 side, there is one transfer unit and the size of the light emitting device 4 is easily reduced.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting device comprising:
light emitting elements that are arranged on a front surface of a substrate and emit light;
a first electrode that is connected to a first line controlling light emission of a light emitting element included in a first light emitting element group; and
a second electrode that is connected to a second line controlling light emission of a light emitting element included in a second light emitting element group,
wherein the first line is provided through a space above the light emitting element of the second light emitting element group,
wherein the light emitting element included in the first light emitting element group, connected to the first line, is disconnected from the second line, and the light emitting element included in the second light emitting element group, connected to the second line, is disconnected from the first line; and
a position at which the first electrode is disposed with respect to a center of the light emitting element and a position at which the second electrode is disposed with respect to a center of the light emitting element are different from each other.

2. A light emitting device comprising:
light emitting elements that are arranged in one direction on a front surface of a substrate and emit light;
a first electrode that is connected to a first line controlling light emission of a light emitting element included in a first light emitting element group; and
a second electrode that is connected to a second line controlling light emission of a light emitting element included in a second light emitting element group,
wherein the first line is provided through a space above the light emitting element of the second light emitting element group,
wherein the light emitting element included in the first light emitting element group, connected to the first line, is disconnected from the second line, and the light emitting element included in the second light emitting element group, connected to the second line, is disconnected from the first line; and
an angle of a position of the first electrode in the light emitting element with respect to the one direction and an angle of a position of the second electrode in the light emitting element with respect to the one direction are different from each other.

3. The light emitting device according to claim 1,
wherein a light emission electrode that is an electrode different from both of the first electrode and the second electrode and that is connected to a light emission wire supplying a light emission current to the light emitting elements is provided between the first line and the second line.

4. The light emitting device according to claim 2,
wherein a light emission electrode that is an electrode different from both of the first electrode and the second electrode and that is connected to a light emission wire supplying a light emission current to the light emitting elements is provided between the first line and the second line.

5. The light emitting device according to claim 3,
wherein the light emitting element includes a plurality of light emission electrodes.

6. The light emitting device according to claim 4,
wherein the light emitting element includes a plurality of light emission electrodes.

7. The light emitting device according to claim 2,
wherein a difference between the angles is any of 90 degrees, 180 degrees, or 270 degrees.

8. The light emitting device according to claim 7,
wherein the difference between the angles is 180 degrees.

9. The light emitting device according to claim 1, further comprising:
a transfer unit that transfers a state of light emission of the light emitting element groups sequentially.

10. The light emitting device according to claim 2, further comprising:
a transfer unit that transfers a state of light emission of the light emitting element groups sequentially.

11. The light emitting device according to claim 3, further comprising:

a transfer unit that transfers a state of light emission of the light emitting element groups sequentially.

12. The light emitting device according to claim 4, further comprising:
a transfer unit that transfers a state of light emission of the light emitting element groups sequentially.

13. The light emitting device according to claim 5, further comprising:
a transfer unit that transfers a state of light emission of the light emitting element groups sequentially.

14. The light emitting device according to claim 6, further comprising:
a transfer unit that transfers a state of light emission of the light emitting element groups sequentially.

15. The light emitting device according to claim 7, further comprising:
a transfer unit that transfers a state of light emission of the light emitting element groups sequentially.

16. The light emitting device according to claim 9,
wherein the transfer unit is provided at one place with respect to a region where the light emitting elements are provided.

17. The light emitting device according to claim 9,
wherein the transfer unit is provided at two places with respect to a region where the light emitting elements are provided.

18. The light emitting device according to claim 1,
wherein the light emitting element includes a light emitting diode and a thyristor that is laminated on the light emitting diode and that causes the light emitting diode to emit light in a case where the thyristor enters an ON state.

19. The light emitting device according to claim 18,
wherein the light emitting diode is a vertical cavity surface emitting laser.

20. A measurement apparatus comprising:
the light emitting device according to claim 1; and
a three-dimensional sensor that receives light reflected from a measurement target that is irradiated with light emitted from the light emitting device.

* * * * *